US008447864B2

(12) United States Patent
Fineberg et al.

(10) Patent No.: US 8,447,864 B2
(45) Date of Patent: May 21, 2013

(54) DISTRIBUTED DIFFERENTIAL STORE WITH NON-DISTRIBUTED OBJECTS AND COMPRESSION-ENHANCING DATA-OBJECT ROUTING

(75) Inventors: Samuel A. Fineberg, Palo Alto, CA (US); Kave Eshghi, Los Altos, CA (US); Pankaj Mehra, San Jose, CA (US); Mark Lillibridge, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 13/466,457

(22) Filed: May 8, 2012

(65) Prior Publication Data

US 2012/0239815 A1  Sep. 20, 2012

Related U.S. Application Data

(63) Continuation of application No. 11/411,386, filed on Apr. 25, 2006, now Pat. No. 8,190,742.

(51) Int. Cl.
*G06F 15/16* (2006.01)

(52) U.S. Cl.
USPC ........... 709/226; 709/201; 709/228; 709/229; 709/230

(58) Field of Classification Search
USPC .......................................... 709/201, 226, 229
See application file for complete search history.

(56) References Cited

U.S. PATENT DOCUMENTS

| 5,408,653 | A | 4/1995 | Josten |
|---|---|---|---|
| 5,574,902 | A | 11/1996 | Josten |
| 5,638,509 | A | 6/1997 | Dunphy |
| 5,990,810 | A | 11/1999 | Williams |
| 6,141,053 | A | 10/2000 | Saukkonen |
| 6,513,050 | B1 | 1/2003 | Williams |
| 6,651,140 | B1 | 11/2003 | Kumar |
| 6,839,680 | B1 | 1/2005 | Liu |
| 6,938,005 | B2 | 8/2005 | Iverson |
| 6,961,009 | B2 | 11/2005 | McCanne |
| 7,082,548 | B2 | 7/2006 | Nakano |
| 7,085,883 | B1 | 8/2006 | Dalgic |

(Continued)

FOREIGN PATENT DOCUMENTS

| WO | 2006030326 A1 | 3/2006 |
|---|---|---|
| WO | 2006094365 A1 | 9/2006 |

(Continued)

OTHER PUBLICATIONS

Fenstermacher et al.; "Mining Client-Side Activity for Personalization" Department of Management Information Systems, Eller College of Business and Public Administration, University of Arizona, Jun. 2002 (8 pages).

(Continued)

*Primary Examiner* — Djenane Bayard

(57) ABSTRACT

One embodiment of the present invention provides a distributed, differential electronic-data storage system that includes client computers, component data-storage systems, and a routing component. Client computers direct data objects to component data-storage systems within the distributed, differential electronic-data storage system. Component data-storage systems provide data storage for the distributed, differential electronic-data storage system. The routing component directs data objects, received from the clients computers, through logical bins to component data-storage systems by a compression-enhancing routing method.

14 Claims, 24 Drawing Sheets

U.S. PATENT DOCUMENTS

| | | |
|---|---|---|
| 7,269,689 B2 | 9/2007 | Eshghi |
| 7,536,291 B1 | 5/2009 | Retnamma |
| 7,558,801 B2 | 7/2009 | Getzinger |
| 2001/0010070 A1 | 7/2001 | Crockett |
| 2002/0103975 A1 | 8/2002 | Dawkins |
| 2002/0156912 A1 | 10/2002 | Hurst |
| 2003/0101449 A1 | 5/2003 | Bentolila |
| 2003/0110263 A1 | 6/2003 | Shillo |
| 2003/0140051 A1 | 7/2003 | Fujiwara |
| 2003/0223638 A1 | 12/2003 | Jackson |
| 2004/0054700 A1 | 3/2004 | Okada |
| 2004/0162953 A1 | 8/2004 | Yoshida |
| 2004/0230559 A1 | 11/2004 | Newman |
| 2005/0091234 A1 | 4/2005 | Hsu |
| 2006/0059173 A1 | 3/2006 | Hirsch |
| 2006/0059207 A1 | 3/2006 | Hirsch |
| 2006/0155735 A1 | 7/2006 | Traut |
| 2006/0293859 A1 | 12/2006 | Pipke |
| 2007/0100913 A1* | 5/2007 | Sumner et al. ............ 707/204 |
| 2007/0220197 A1 | 9/2007 | Lasser |
| 2007/0250519 A1 | 10/2007 | Fineberg |
| 2007/0250670 A1 | 10/2007 | Fineberg |
| 2008/0126176 A1 | 5/2008 | Iguchi |
| 2009/0019227 A1 | 1/2009 | Koski |
| 2009/0112945 A1 | 4/2009 | Camble |
| 2009/0112946 A1 | 4/2009 | Jones |
| 2009/0113167 A1 | 4/2009 | Camble |
| 2010/0161554 A1 | 6/2010 | Datuashvili |
| 2010/0198792 A1 | 8/2010 | Camble |
| 2010/0198832 A1 | 8/2010 | Jones |
| 2010/0205163 A1 | 8/2010 | Eshghi |
| 2010/0235372 A1 | 9/2010 | Camble |
| 2010/0235485 A1 | 9/2010 | Lillibridge |
| 2010/0246709 A1 | 9/2010 | Lillibridge |
| 2010/0280997 A1 | 11/2010 | Lillibridge |
| 2010/0281077 A1 | 11/2010 | Lillibridge |

FOREIGN PATENT DOCUMENTS

| | | |
|---|---|---|
| WO | 2006094366 A1 | 9/2006 |
| WO | 2006094367 A1 | 9/2006 |
| WO | 2007127248 A2 | 11/2007 |
| WO | 2009054828 A1 | 4/2009 |
| WO | 2009131585 A1 | 10/2009 |

OTHER PUBLICATIONS

Baoyao, Zhou; ""Intelligent Web Usage Mining"" Nanyang Technological University, Division of Information Systems, School of Computer Engineering, 2004 (94 pages).

Baynote Inc.: The Collective Intelligence Platform, Online, http://www.baynote.com/technology/platform/ 2010 (1 page).

Hottolink Inc.; "Recognize" Online, http://www.hottolink.co.jp/english/reconize.html, 2009 (2 pages).

Andrejko et al.: User Characteristics Acquisition from Logs with Semantics, Slovak University of Technology in Bratislava, 2007 (8 pages).

Hongjun Lu et al: Extending a Web Browser with Client-Side Mining, Hong Kong University of Science and Technology Department of Computer Science, Clear Water Bay, Kowloon, Hong Kong, China, 2003 (12 pages).

Shankar et al.; ""Personalized Web Search Based on Client Side Ontology"", CS 498: B.Tech Project,10. IIT Kanpur, India 2010 (9 pages).

Sendhikumar et al.; "Personalized ontology for web search personalization" Anna University, Chennai, India , 2008 (7 pages).

Shahabi et al.; "Yoda an Accurate and Scalable Web based Recommendation System?" University of SouthernCalifornia, Los Angeles, Sep. 2001 (14 pages).

Why Wubat? Website User Behavior & Analysis Tool, Wubat, Online, http://www.wubat.com/ dated on or before Oct. 12, 2010 (3 pages).

Claypool et al.; "Implicit Interest Indicators", Worcester Polytechnic Institute, Worcester, Computer Science Department Worcester Polytechnic Institute Worcester, MA 01609, USA., 2001 (8 pages).

Shahabi et al.; A Framework for Efficient and Anonymous Web Usage Mining Based on Client-Side Tracking, University of Southern California, Los Angeles, 2002 (48 pages).

Clattertrap; Online http://www.clattertrap.com; Jul. 20, 2010 (1 page).

HSNW: SRI defense technology spawns civilian application: published Jun. 29, 2010 (2 pages).

Anthony Ha: Facebook investor backs Chattertrap, a personal assistant for content, Jun. 29, 2010 (6 pages).

U.S. Appl. No. 11/411,467, Non-Final Rejection dated Jan. 27, 2009 (pp. 1-9 and attachments).

U.S. Appl. No. 11/411,467, Final Rejection dated Aug. 11, 2009 (pp. 1-11 and attachment).

U.S. Appl. No. 11/411,467, Examiner's Answer dated May 11, 2010 (pp. 1-11 and attachment).

Muthitacharoen Athicha, et al., "A Low-Bandwidth Network File System," Proceedings of the 18th ACM Symposium on Operating Systems Principles (SOSP '01), Oct. 2001.

Eshghi et al., "Jumbo Store: Providing Efficient Incremental Upload and Versioning for a Utility Rendering Service," 2007 (16 pages).

U.S. Appl. No. 10/870,783, Non-Final Rejection dated Dec. 15, 2006, pp. 1-4 and attachments.

U.S. Appl. No. 10/870,783, Notice of Allowance dated Jun. 13, 2007 (7 pages).

Brin, Sergey, et al., "Copy Detection Mechanisms for Digital Documents", Department of Computer Science, Stanford University, Oct. 31, 1994, p. 1-12.

Manber, Udi, "Finding Similar Files in a Large File System," Department of Computer Science, University of Arizona, TR 93-33, Oct. 1993, (11 pages).

Rabin, M.O., "Fingerprinting by Random Polynomials," Technical Report, Center for Research in Computing Technology, Harvard University, 1981, Report TR-15-81 (14 pages).

U.S. Appl. No. 12/432,804, Non-Final Rejection dated Apr. 8, 2011, pp. 1-16 and attachment.

You L. L. et al., "Deep Store an Archival Storage System Architecture" Data Engineering, 2005. ICDE 2005. Proceedings. 21st. intl Conf on Tokyo, Japan, Apr. 5-8, 2005, pp. 12.

L. L. You and C. Karamanolis. Evaluation of Efficient Archival Storage Techniques. In Proceedings of the 21st IEEE / 12th NASA Goddard Conference on Mass Storage Systems and Technologies, pp. 227-232, College Park, Maryland, Apr. 2004.

EMC "Centera Content Addressed Storage Product Description Guide" Internet Citation, [Online] 2002 (20 pages).

U.S. Appl. No. 12/432,804, Final Rejection dated Aug. 9, 2011, pp. 1-20 and attachments.

* cited by examiner

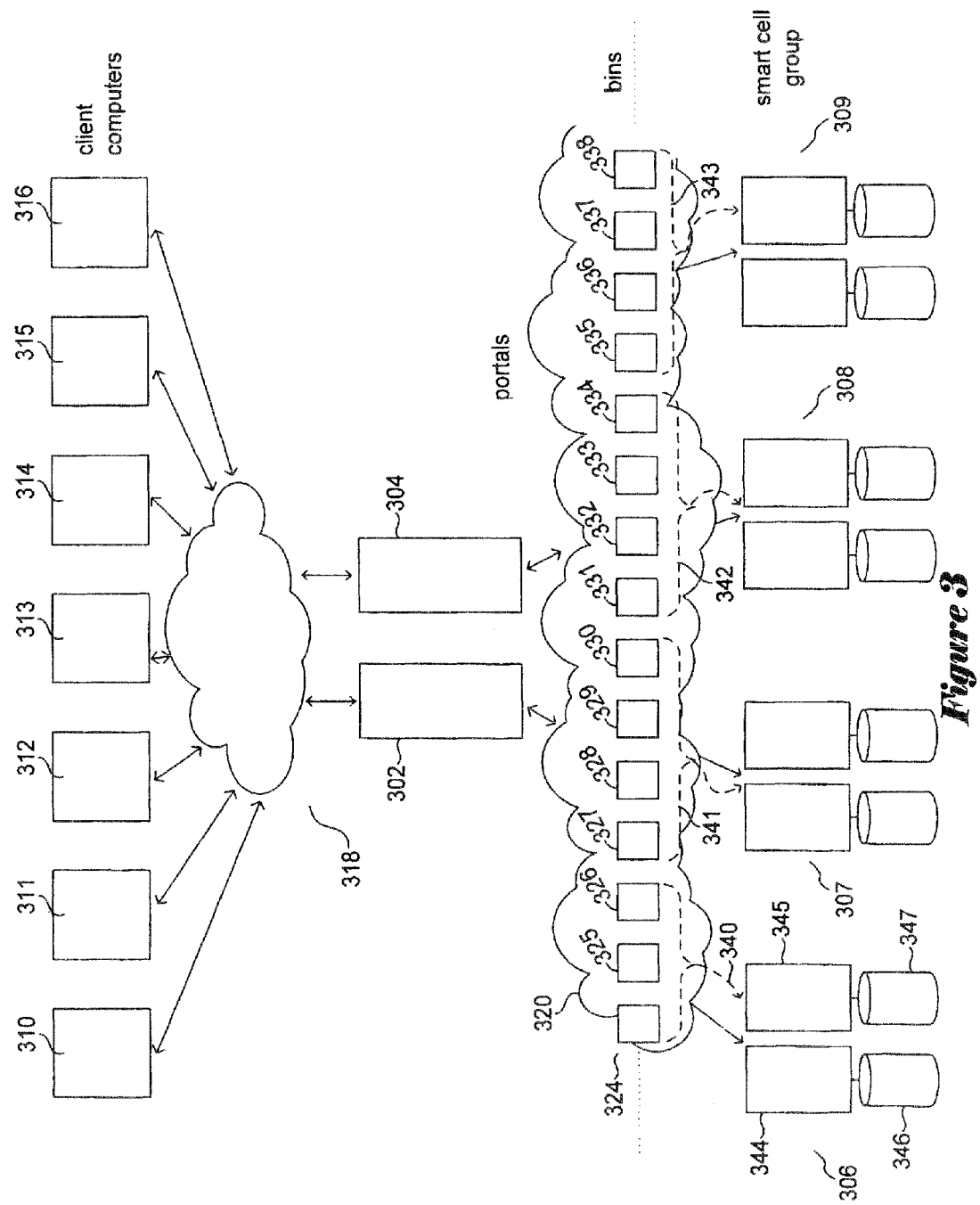

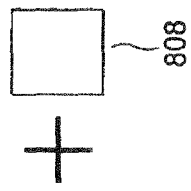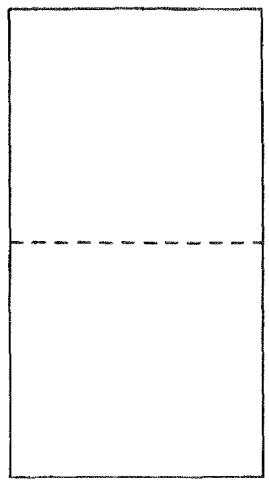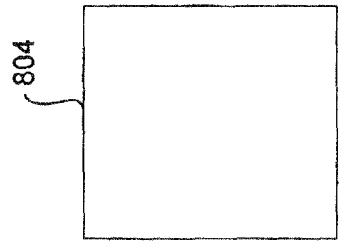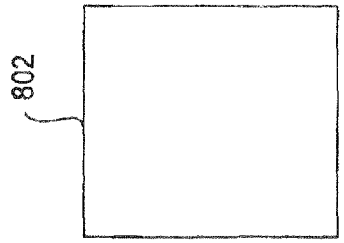
*Figure 8A*
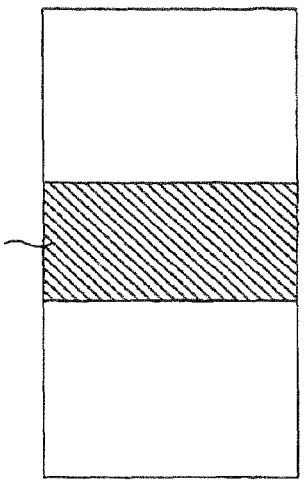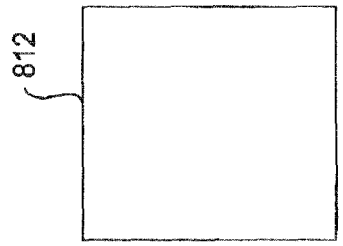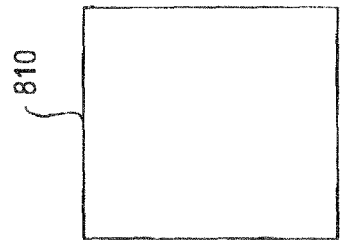
*Figure 8B*

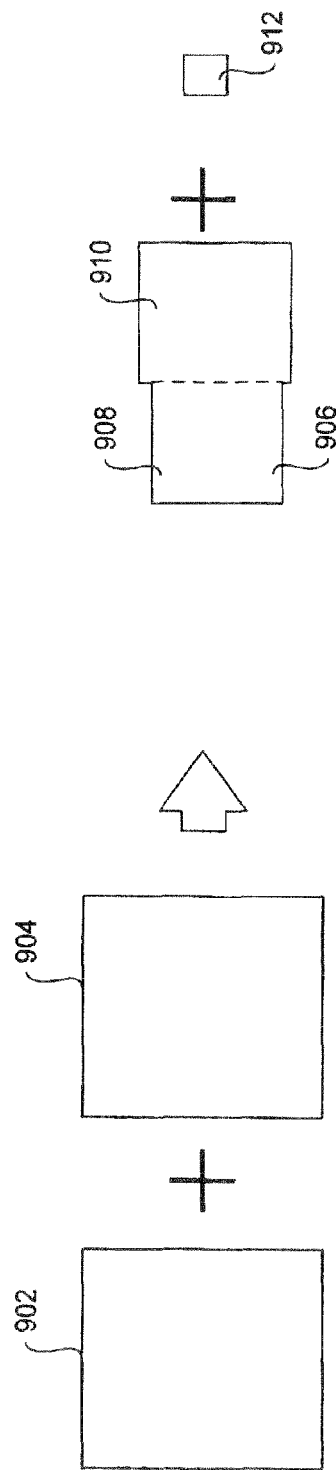
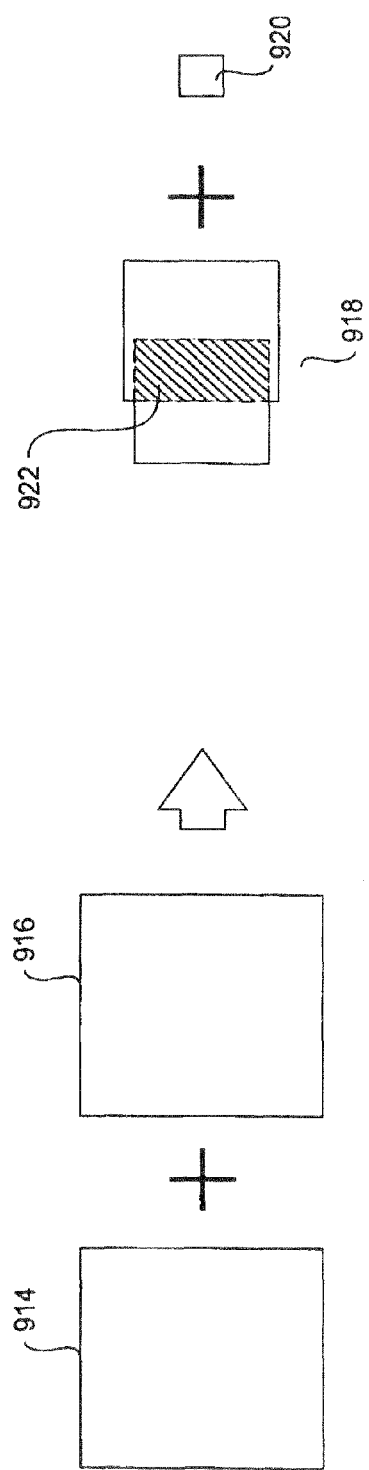
Figure 9A
Figure 9B

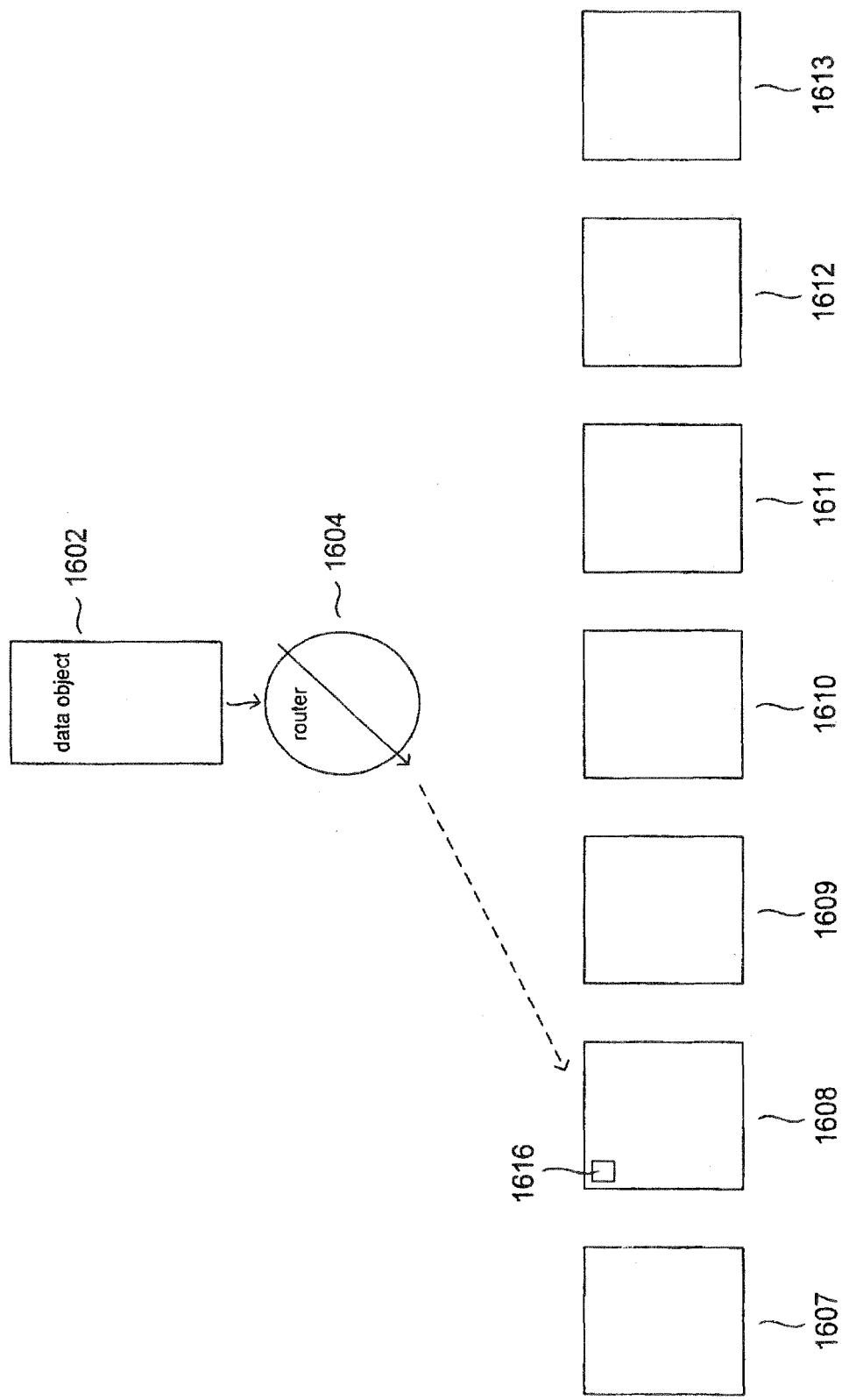

DISTRIBUTED DIFFERENTIAL STORE WITH NON-DISTRIBUTED OBJECTS AND COMPRESSION-ENHANCING DATA-OBJECT ROUTING

CROSS-REFERENCE TO RELATED APPLICATION

This application is a continuation of U.S. Ser. No. 11/411,386, filed Apr. 25, 2006, U.S. Pat. No. 8,190,742, which is hereby incorporated by reference.

TECHNICAL FIELD

The present invention is related to data storage systems and, in particular, to distributed, differential electronic-data storage systems that do not distribute data objects across multiple component storage systems and that employ compression-enhancing data-object routing methods that route data objects to component storage systems in order to achieve large data-compression ratios for stored data objects.

BACKGROUND OF THE INVENTION

Since the 1960's, the computer hardware and software industries have provided a relentless and spectacular increase in the capabilities and functionalities of computer-based data processing systems. For example, contemporary office workers are typically equipped with modem personal computers ("PCs") that surpass, in processor speeds, memory sizes, and mass-storage capacities, supercomputers of only 20 years ago. Networking technologies allow PCs to be interlinked with one another and with powerful servers and other computational resources to provide extremely high-bandwidth interconnection between computer users, access by users to vast computational resources, and immense capacities for data storage and retrieval. Today, large and complex business organizations can easily implement highly interconnected, paperless work environments using relatively inexpensive, commercially available computer hardware and software products. However, as the capabilities of computer hardware and software have increased, the rate and amount of data that is generated and computationally managed in business, commercial, and even home environments, has rapidly increased. Computer users may receive hundreds of emails each day, many including photographs, video clips, and complex, multi-media documents. Moreover, many computer users routinely generate large numbers of text documents, multimedia presentations, and other types of data. Much of this data needs to be managed and stored for subsequent retrieval. Recent legislation mandates, for example, reliable storage of emails and other electronic communications generated and received in certain business environments for lengthy periods of time, spanning decades. Although it is possible to purchase ever-larger mass-storage devices and ever-increasing numbers of servers to manage backup and archiving of electronic data on the mass-storage devices, the expense, management overhead, and administrative overhead of storing and managing the large amounts of electronic data may quickly reach a point of commercial and economical impracticality. For these and other reasons, computer users, business and research organizations, vendors of computer systems and computer software, and various governmental organizations have all recognized the need for improved, more cost-effective methods and systems for backing up and archiving electronic data.

SUMMARY OF THE INVENTION

One embodiment of the present invention provides a distributed, differential electronic-data storage system that includes client computers, component data-storage systems, and a routing component. Client computers direct data objects to component data-storage systems within the distributed, differential electronic-data storage system. Component data-storage systems provide data storage for the distributed, differential electronic-data storage system. The routing component directs data objects, received from the clients computers, through logical bins to component data-storage systems by a compression-enhancing routing method.

BRIEF DESCRIPTION OF THE DRAWINGS

FIG. 3 illustrates the components and component organization of a distributed, differential electronic-data backup and archiving system that represents various embodiments of the present invention.

FIGS. 8A-B illustrate the difference between a differential data store and a non-differential data store.

FIGS. 9A-B show a more general case in which data objects are compressed individually as well as by differential-storage compression.

FIG. 16 abstractly illustrates data-object routing by methods of the present invention.

DETAILED DESCRIPTION OF THE INVENTION

Various embodiments of the present invention include a variety of different types of distributed, differential electronic-data storage systems in which stored data objects are fully contained within individual component storage systems. In these various embodiments of distributed, differential electronic-data storage systems, data objects may be routed to component storage systems through logical bins in order to increase the flexibility and robustness of the distributed, differential electronic-data storage systems. The various distributed, differential electronic-data storage systems of the present invention employ compression-enhancing data-object routing methods that direct data objects to those component data-storage systems in which the data objects can be stored with best compression. Compression-enhancing routing methods include content-based compression-enhancing routing methods and query-based compression-enhancement routing methods. Query-based compression-enhancing routing methods further include trial-storage-based query methods, similarity-key-based query methods, and hash-list-based query methods. In a first subsection, below, a general architecture for distributed, differential electronic-data storage systems that represent embodiments of the present invention is provided. In a second subsection, bin-based indirect data-object routing is discussed. In a third subsection, differential-data-storage compression and differential-data-storage metrics used for evaluating the efficiency of differential data-storage systems are described. In a fourth subsection, an overview of compression-enhancing routing is provided. In a fifth subsection, content-based compression-enhancing routing methods are discussed. Finally, in a sixth subsection, query-based compression-enhancing routing methods are discussed.

Figure 1:
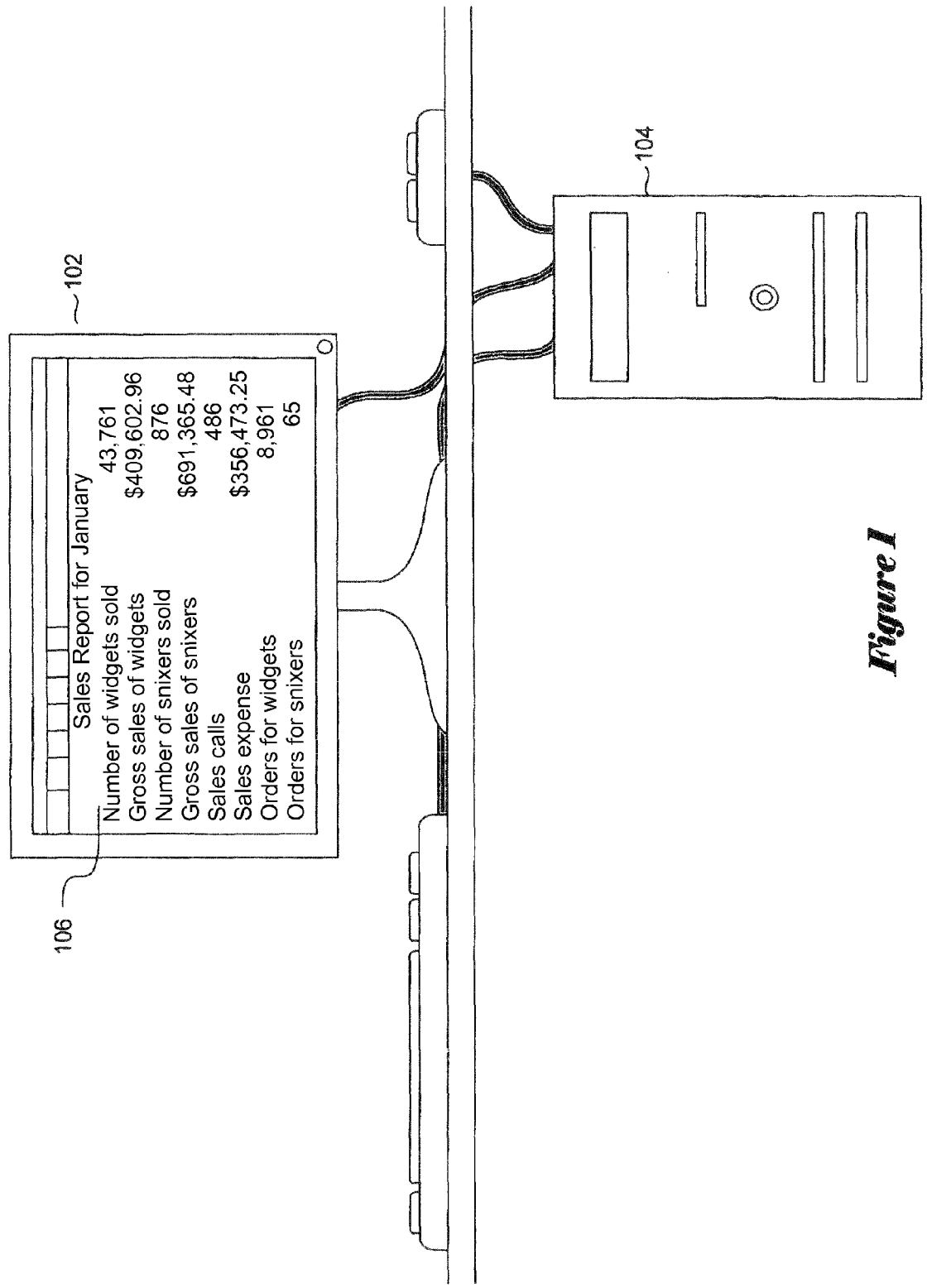
FIG. 1 shows a typical personal computer used in a home or commercial environment.

General Architecture for the Distributed, Differential Electronic-Data Storage Systems Non-Distributed Data Storage Systems FIG. 1 shows a typical personal computer used in a home or commercial environment. Personal computers ("PCs") include high-resolution displays 102 and fast processors, large internal RAM memories, and one or more high-capacity disk drives within a main enclosure 104 that allows the PC to store and display many different types of data objects, including photographs, video clips with sound, text documents, multi-media documents, databases, a huge variety of formatted data files, and other such data objects. Many data objects, such as the sales report 106 displayed by the PC shown in FIG. 1, contain information that a user may need to store for various periods of time and refer to subsequently. Business or commercial procedures may require storage of data objects for business and legal purposes. Recently enacted legislation requires certain types of businesses to reliably retain emails and other data objects for specified periods of time, including emails and documents related to various types of asset sales. In addition to needs and requirements for archiving data objects, users may also wish to back up important data objects to protect against failure of the disk drive or other components within the user's PC.

In a first approach to backing up and archiving data, a user may invest in multiple disk drives for the PC, and store backup and archival copies of important data objects on a disk drive allocated for backup and archiving. In slightly more sophisticated systems, a user may employ two or more disk drives within a PC and operating-system features to implement an automated mirroring process by which an exact, mirror copy of a working disk drive is maintained on a separate, mirror disk drive. However, these techniques are inadequate in many commercial and even home situations. First, even when multiple disk drives are employed, theft of, or significant damage to, the PC may nonetheless lead to irretrievable loss of data. Moreover, as operating systems and application programs continue to evolve, the data objects routinely generated by users have tended to become larger and more complex, and are generated at ever-increasing rates. Therefore, a PC often lacks sufficient mass-storage capacity for long-term archiving. Finally, localized strategies for backing up and archiving data generally involve significant management and administrative overhead, as a result of which users often tend to neglect to properly maintain backed up and archived data, and frequently fail to continuously backup and archive data that they may subsequently need. Commercial and governmental organizations cannot generally rely on individual users and employees to administer data backups and data archiving.

Figure 2:
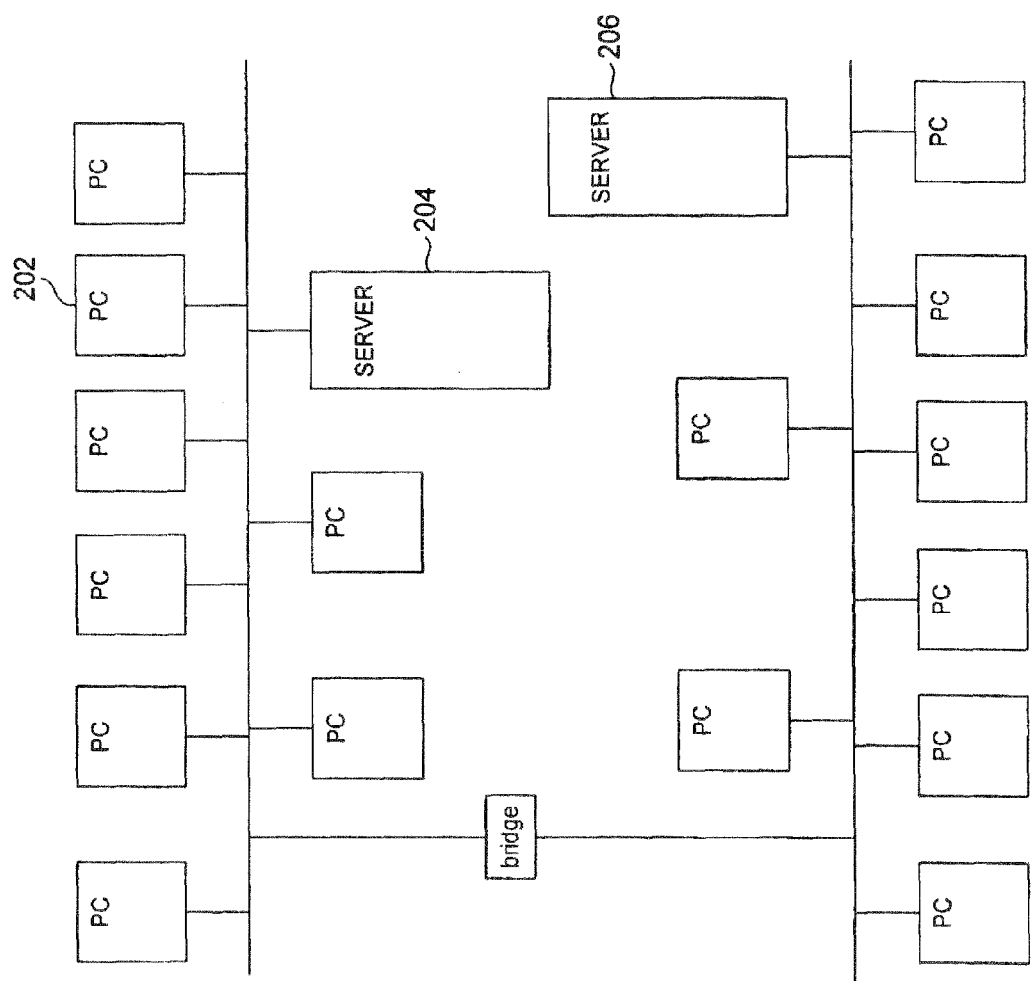
FIG. 2 illustrates a small system of networked computers that might be found within a business organization.

For all of the reasons discussed above, computer users within commercial and governmental organizations, and even certain sophisticated home users of PCs, generally centralize important backup and archiving tasks and policies on servers or larger computers to which the users' PCs are interconnected via computer networks. FIG. 2 illustrates a small system of networked computers that might be found within a business organization. Multiple PCs, including PC 202, are interconnected with one another and with two servers 204 and 206. A system administrator for the networked system generally implements and maintains automated data backup and data archiving using any number of commercially available backup and archiving products. In larger organizations, the servers may be interconnected with independent, large scale mass-storage devices, such as RAID systems, for increased storage capacity.

Networked computer systems with servers dedicated to backup and archiving tasks are far more reliable than localized backup and archiving techniques discussed with reference to FIG. 1. However, even when backup and archiving are administered by a system administrator through one or more high-end servers, serious problems may nonetheless be encountered. For example, even though the servers may be located in a room, floor, or building remote from the locations of the PCs, the entire system may still be susceptible to catastrophic damage from fires, earthquakes, or malicious employees. Furthermore, systems such as the networked computer system illustrated in FIG. 2 are often difficult to scale in order to satisfy increasing needs for data-storage capacity. Adding a new server with attached mass-storage devices may involve significant effort, on the part of system administrators and network administrators, and may require extensive redistribution of data among servers, reconfiguration of individual PCs, and other administrative and management overhead. Furthermore, managing multiple, possibly different servers and adding servers with new or revised operating systems and other components may be quite difficult. Finally, the approaches typified by the network computer system illustrated in FIG. 2 do not efficiently store redundant data. As one example, all or a majority of the employees within an organization may receive many identical emails from internal and even outside sources. These emails may include large attachments, such as .doc files, .ppt files, or .pdf files. Simplistic backup and archiving techniques may redundantly store an identical email sent to 15 employees within the organization 15 times, although a single, reliably stored copy of the email may be sufficient to meet the backup and archiving policies of the organization.

Distributed Electronic Data Archiving

In order to overcome many of the problems of localized backup and archiving, discussed above with reference to FIG. 1, and with ad hoc backup and archiving methods carried out in systems of networked computers, discussed above with reference to FIG. 2, distributed electronic-data backup and archiving systems have been developed. FIG. 3 illustrates the components and component organization of a distributed, differential electronic-data backup and archiving system that represents various embodiments of the present invention. As shown in FIG. 3, one or more portals 302 and 304, generally server computers, serve as an interface between the distributed, differential electronic-data backup and archiving system, which includes both the portals and multiple component data-storage systems 306-309, and a potentially large number of client computers, such as client computers 310-316 shown in FIG. 3. In the embodiment illustrated in FIG. 3, the portals receive STORE, RETRIEVE, and other requests from client computers via any of various types of communications media 318 and direct the requests received from the client computers through any of various types of communications media 320 to the component data-storage systems 306-309 of the distributed, differential electronic-data backup and archiving system. Each component data-storage system may include two or more individual computer systems (e.g. systems 340 and 342 of component data storage system 306). Responses to the requests are transmitted from the component data-storage systems back to the portals, which then distribute the responses to the requesting client computers. In certain embodiments, requests are directed by portals to logical bins 324-338 which are, in turn, mapped by the portals 302 and 304 to the component data-storage systems 306-309, in order to facilitate addition of component data-storage systems to an existing distributed, differential store in order to meet increased demands for data-storage capacity. Remapping of the bins by, for example, partitioning bins mapped to a particular component data-storage system into two groups, and assigning one grouped to a new component data-storage system, allows for simple addition of the new component data-storage system to the distributed, differential electronic-data backup and archiving system.

Each component data-storage system, such as component data-storage system 306, in the distributed, differential electronic-data backup and archiving system comprises one or more computer systems, such as computer systems 344 and 345 in component data-storage system 306. Each computer system has attached mass-storage devices, including attached mass-storage devices 346 and 347 connected to computer systems 344 and 345, respectively. Multiple computer systems with separate, attached mass-storage devices allow for mirroring of data stored in each component data-storage system to increase both availability and reliability of the data store.

Although the component organization shown in FIG. 3 is one example of organization of the components of a client-computer/distributed-differential-electronic-data-backup-and-archiving system, many other component configurations, organizations, and interconnections are possible. For example, in certain embodiments, client computers may directly interface to component data-storage systems through one or more communications media in order to carry out STORE and RETRIEVE transactions with the distributed, differential electronic-data backup and archiving system. In other words, in certain embodiments, portals may be responsible only for receiving and forwarding a subset of requests generated by client computers or, in other embodiments, the portal-based interface may be eliminated altogether. As another example, component data-storage systems in certain embodiments may comprise only a single computer system with attached storage, with data redundancy achieved by means other than inter-device mirroring. However, the component organization and interconnection shown in FIG. 3 is used in the following description of the present invention as an exemplary platform on which method and system embodiments of the present invention are implemented.

A distributed electronic-data backup and archiving system addresses many of the problems associated with PC-based backup and archiving and ad hoc backup and archiving in networked systems, discussed above with respect to FIGS. 1 and 2, respectively. The distributed electronic-data backup and restore system is an integrated system that provides a relatively simple interface to client computers and other computer resources within an organization. The distributed electronic-data backup and archiving system may be relatively easily managed through management interfaces, may be geographically distributed to prevent data loss associated with catastrophes that may affect all of the computers within a single geographical location, and is easily scaleable, as discussed above, by adding additional component data-storage systems. New component data-storage systems are straightforwardly accommodated by the current distributed electronic-data backup and archiving system, and the granularity of data-storage-capacity increase represented by a component data-storage system allows for non-disruptive and cost-effective tracking of data-storage-capacity needs. The management and administrative burdens associated with integrated distributed electronic-data backup and archiving systems is substantially lower than for the above-discussed ad hoc systems and PC-based backup and archiving. Finally, the distributed electronic-data backup and archiving system allows for efficient differential storage of data, as discussed in the following subsection, which significantly decreases physical data-storage requirements within an organization.

Bin-Based Indirect Data-Object Routing

Figure 4A:
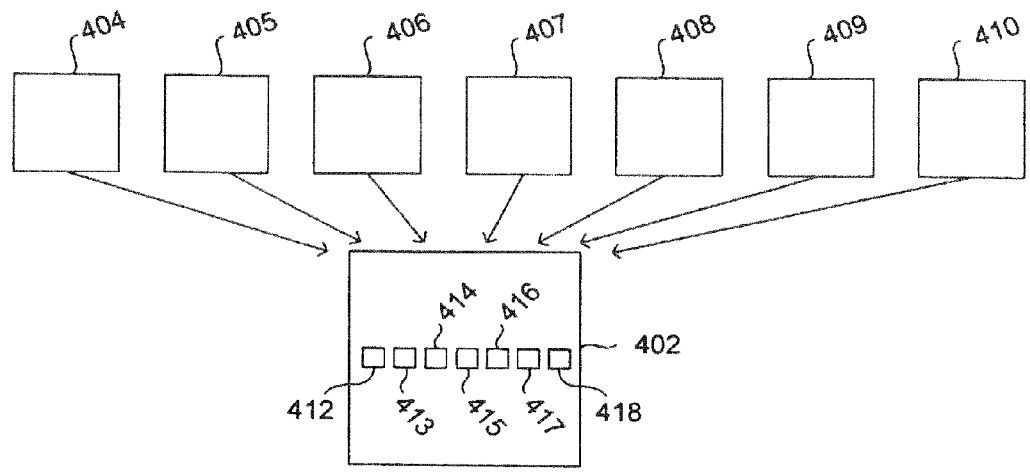
FIGS. 4A-C illustrate flexibility and robustness that can be achieved by assigning a large number of bins to a particular component data-storage system according to various embodiments of the present invention.
Figure 4B:
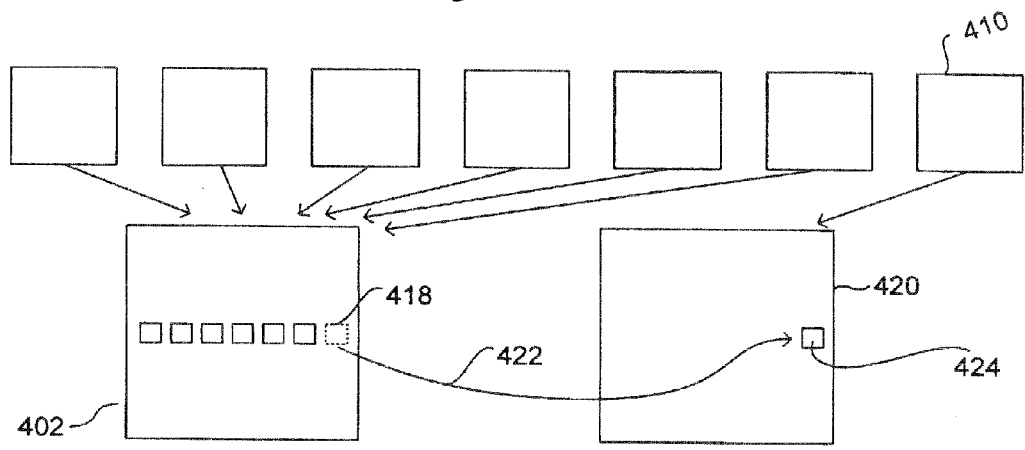
Figure 4C:
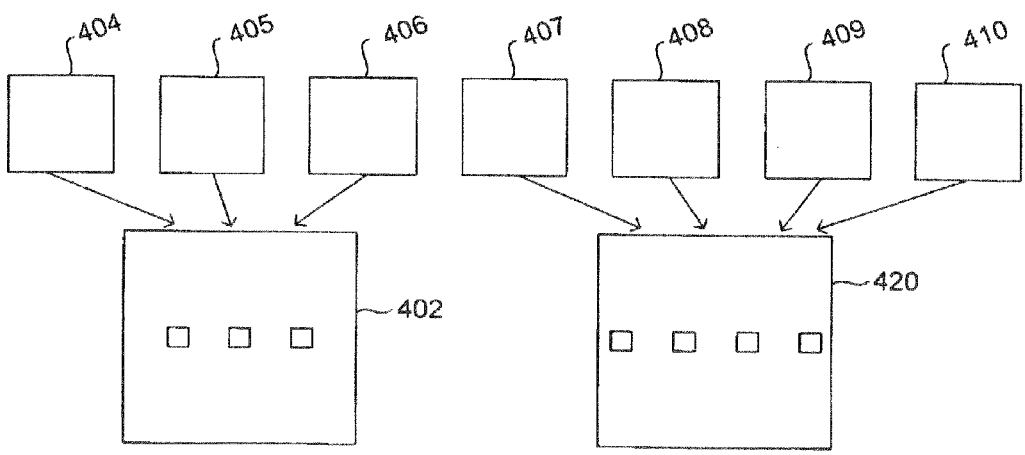

As discussed above, logical bins represent logical targets for routing data objects for storage. Logical bins may be known only to a routing method carried out on portal computers or on client computers, and may exist only as a software abstraction to isolate routing-method implementations from other software components involved in management, configuration, and monitoring of a distributed, differential electronic-data storage system. Logical bins (324-338 in FIG. 3) may provide for a high degree of flexibility and significant increase in robustness and reliability of a distributed, differential electronic-data storage system. FIGS. 4A-C illustrate flexibility and robustness that can be achieved by assigning a large number of bins to a particular component data-storage system according to various embodiments of the present invention. FIG. 4A shows a component data-storage system 402 to which data objects are directed through seven different logical bins 404-410. In FIG. 4A, the data objects stored as a result of being directed through each of the seven logical bins are shown by seven, small internal squares 412-418, each corresponding to a respective logical bin.

As data objects continue to be stored to a distributed, differential electronic-data storage system, particularly when the distributed, differential electronic-data storage system is employed for data archiving and other such purposes that involve relatively large numbers of storage operations and significantly fewer data-object deletion operations, a given component data-storage system may begin to approach maximum storage capacity. As the component data-storage system more closely approaches maximum storage capacity, storage operations may become more costly in both time and processing cycles. At some point, the component data-storage system may not be able to sufficiently rapidly store additional data objects, or may lack sufficient remaining data storage to store additional data objects. A component data-storage system may also begin to exhibit sporadic error conditions, or may begin to fail altogether.

For these and a variety of other reasons, it may be desirable to reallocate the bins through which data objects are directed to an over-utilized or failing component data-storage system to one or more newly added or currently under-utilized component data-storage systems. FIGS. 4B-C illustrate reallocation of the bins shown in FIG. 4A in order to add an additional component data-storage system to a distributed, differential electronic-data storage system. As shown in FIG. 4B, a logical bin 410 can be associated with a new component data-storage system 420 by redirecting objects routed to the logical bin 410 to the new component data-storage system 420 as well as optionally copying 422 the data objects 418 stored in the original component data-storage system 402 through the logical bin 410 to the new component data-storage system 424. Copying is needed when a component data-storage system is removed from the distributed, differential electronic-data storage system, and optional when only bin reassignment, but not component-data-storage-system removal, is carried out. In certain systems, the stored data objects may be copied to the new component data-storage system prior to association of the logical bin with the new component data-storage system, while, in other systems, the logical bin may be first associated with the new component data-storage system, and data-object copying may be carried out over a subsequent period of time. FIG. 4C shows the reallocation of logical bins shown in FIG. 4A by successive bin-re-association operations so that data objects routed through logical bins 404-406 continue to be routed to the initial component data-storage system 402 and data objects routed through logical bins 407-410 are now routed to the new, additional component data-storage system 420. Bin reallocation may be carried out in steps of larger granularity than a single logical bin, and logical bins may be reallocated across any subset of component data-storage systems. The subset of component data-storage systems may include one or more component data-storage systems to which the logical bins were originally allocated, or may contain only new or currently under-utilized component data-storage systems to which the logical bins were not initially allocated. Reallocation of logical bins among component data-storage systems thus provides for a relatively straightforward ability to dynamically add component data-storage systems to a distributed electronic-data storage system to increase overall system capacity, and to substitute for, or remove, component data-storage systems for a variety of reasons. For example, in the example component-data-storage-system subset shown in FIGS. 4A-C, all of the seven bins could be reallocated from the original component data-storage system 402 to the new component data-storage system 420. The original component data-storage system 402 could then be removed or temporally powered off. Reallocation of logical bins is significantly easier than routing data objects to a constantly changing set of component data-storage systems. By using logical bins, the general routing method, examples of which are discussed below, may not need to be changed, but instead only changes to a relatively isolated bin-to-component-data-storage-system mapping may need to be made.

Figure 5A:
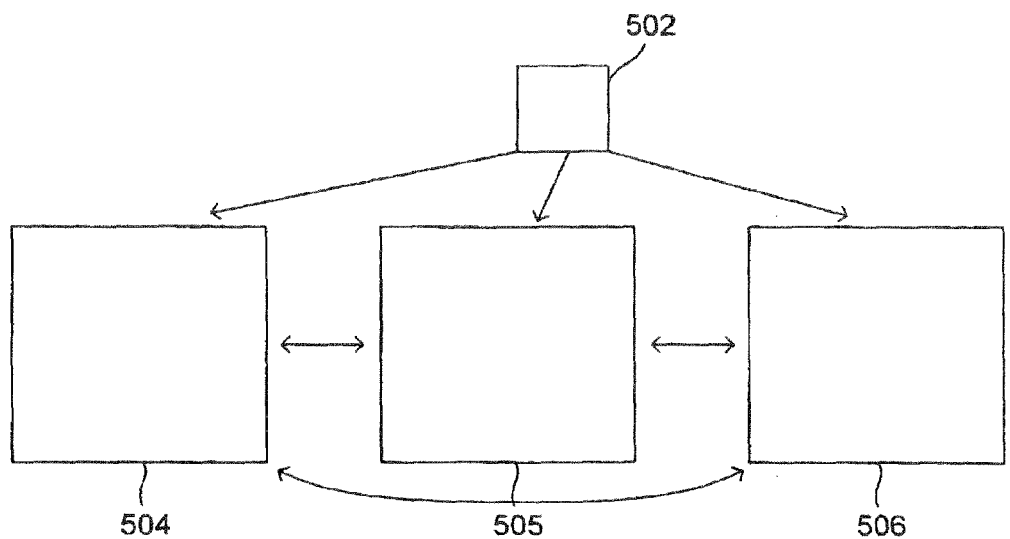
FIGS. 5A-C illustrate a one-to-many mapping from a single logical bin to multiple component data-storage systems, and a component-data-storage-system deletion operation according to various embodiments of the present invention.
Figure 5B:
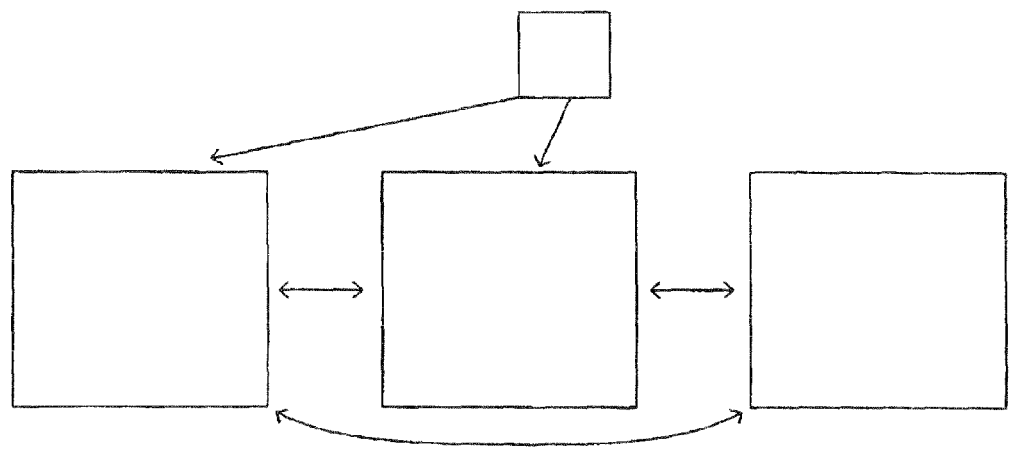
Figure 5C:
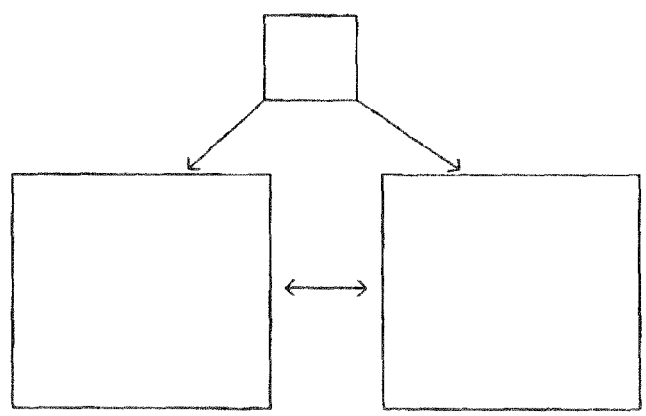

On the other hand, data objects may be routed through a single logical bin to multiple component data-storage systems. FIGS. 5A-C illustrate a one-to-many mapping from a single logical bin to multiple component data-storage systems, and a component-data-storage-system deletion operation according to various embodiments of the present invention. In FIG. 5A, data objects are routed through a single logical bin 502 to three different component data-storage systems 504-506. The three component data-storage systems 504-506 are fully interconnected by any of various communications media and cooperate with one another in order to store data objects directed to the three component data-storage systems through the single logical bin 502. For example, one of the three component data-storage systems may be designated the active component data-storage system for the single logical bin 502, and may initially receive all data objects directed through the single logical bin 502. This active component data-storage system may then redistribute received data objects to other of the component data-storage systems to which data objects are directed through the logical bin 502. In alternative embodiments of the present invention, the routing software resident on portal computer systems or client computer systems may direct data objects through the logical bin 502 to a particular one of the three component data-storage systems 504-506 by any of various distribution techniques, including round-robin techniques, techniques based on monitoring the remaining capacity of the three component data-storage systems, and other techniques. By having multiple component data-storage systems receive data objects through a single logical bin, communications and processing bottlenecks that may arise because of high data-object traffic through a particular logical bin may be removed or ameliorated. Furthermore, component data-storage-system failures may be very easily addressed by removing a failed component data-storage system without alteration of the routing method by which data objects are routed through logical bins. For example, FIGS. 5B-C illustrate discontinuing routing of data objects through the single logical bin 502 to component data-storage system 506 and removal of component data-storage system 506. In cases where data objects are redundantly stored across component data-storage systems, or in cases in which data objects are not redundantly stored, but in which data objects can be transferred from the component data-storage system that is to be deleted, then no loss of data or interruption in data-object-retrieval operation execution is suffered by deleting one of multiple component data-storage systems to which data objects are directed through a single logical bin.

Figure 6:
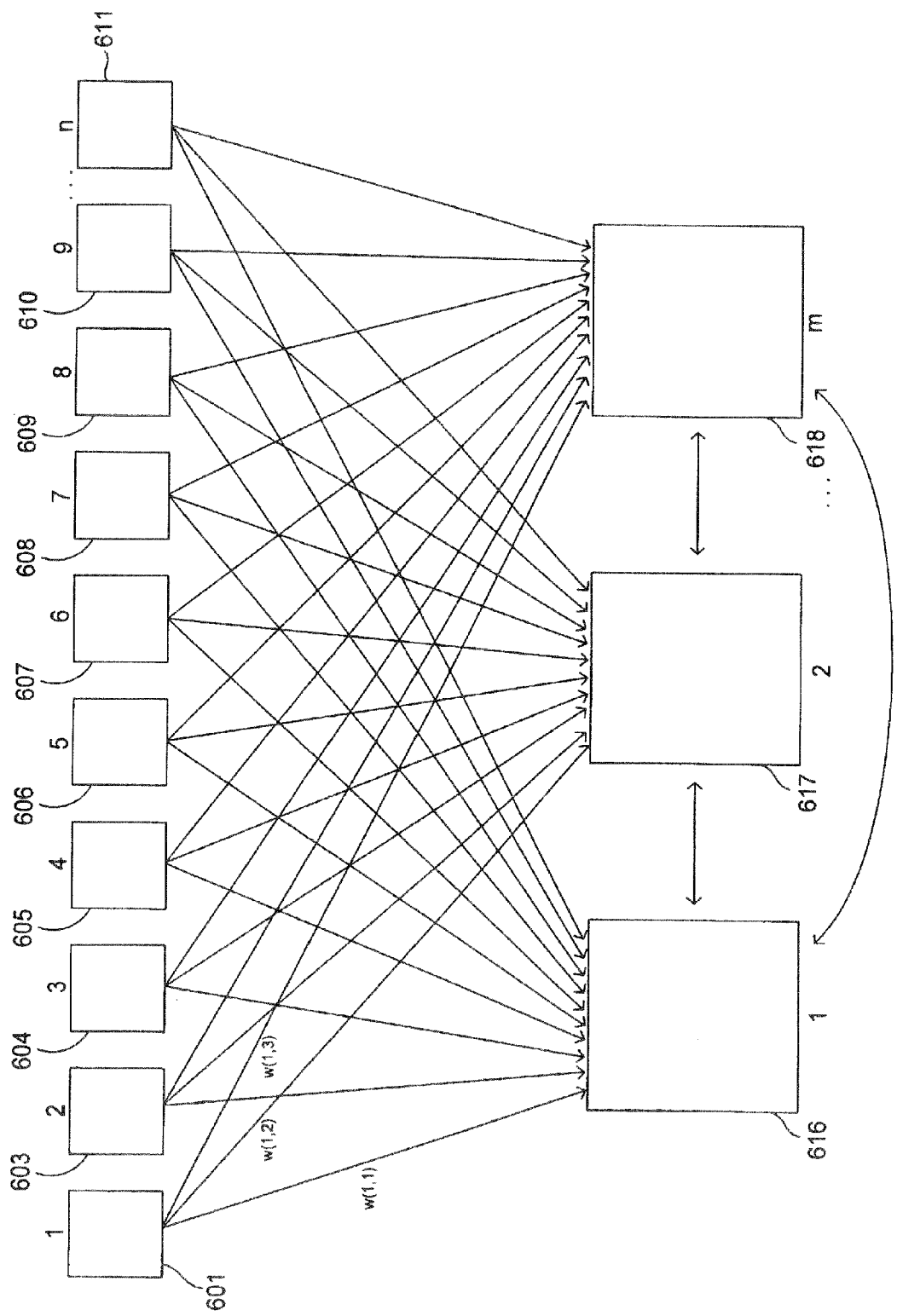
FIG. 6 illustrates a full mapping between n logical bins and m component data-storage systems according to various embodiments of the present invention.

Many other types of mappings between logical bins and component data-storage systems are possible. FIG. 6 illustrates a full, cross-product-like mapping between n logical bins 602 and 611 and m component data-storage systems 616-618 according to various embodiments of the present invention. Any particular mapping of all possible mappings between logical bins and component data-storage systems may be achieved by assigning weights to each possible logical-bin-to-component-data-storage-system association. Zero weights indicate no mapping between a logical bin and a component data-storage system, and non-zero weights may indicate the strength of the mapping between a particular logical bin and a component data-storage system. For example, if weights range from 0 to 1, and if the total weights of all associations between a given logical bin and all m component data-storage systems is equal to 1, then the weight assigned to a logical-bin-to-component-data-storage-system association may indicate the proportion of data objects directed through a logical bin that are subsequently directed to the component data-storage system associated with the logical bin.

Figure 7:
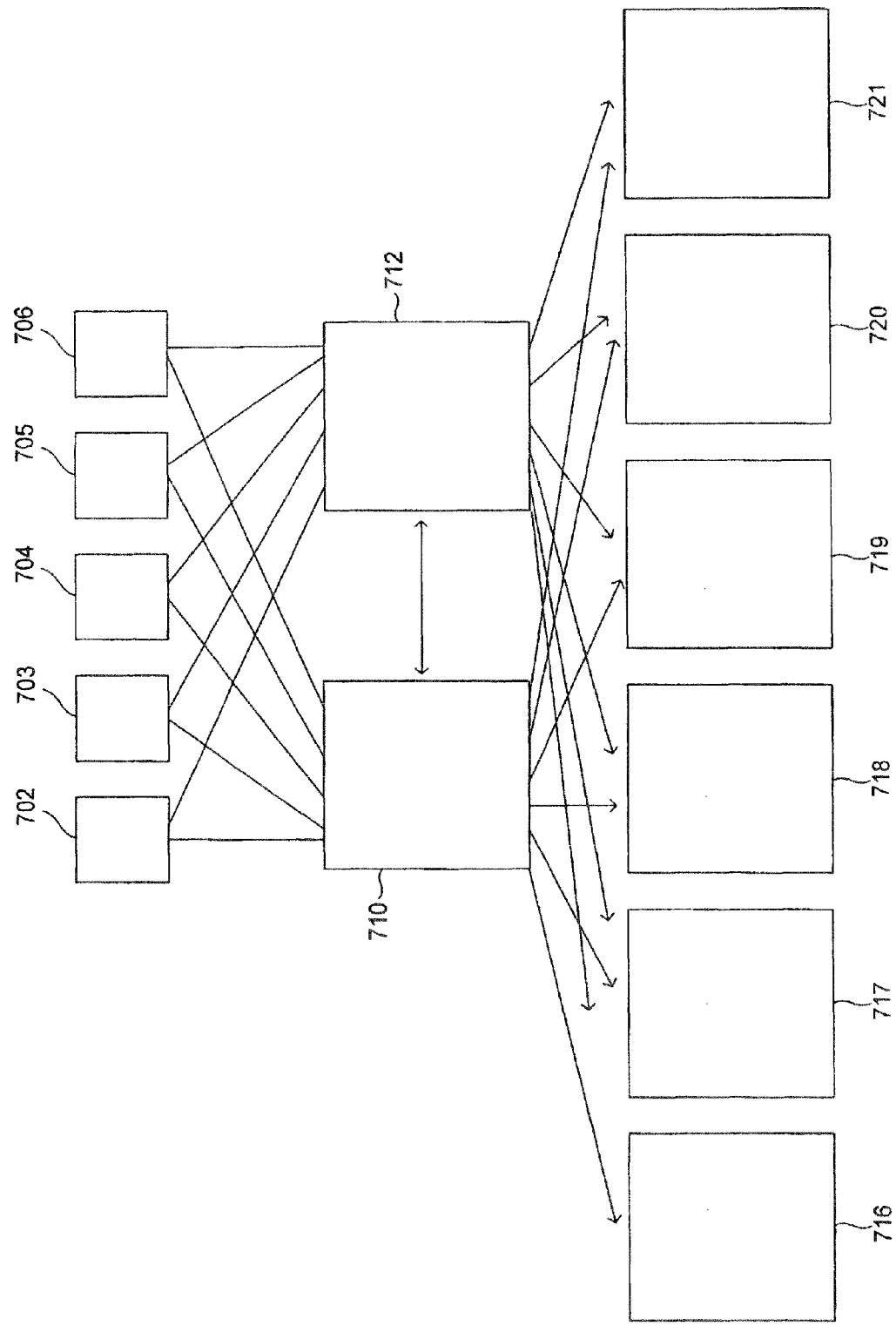
FIG. 7 shows that hierarchical interconnections and/or associations of component data-storage systems to which data objects are directed through logical bins may also be possible in various embodiments of the present invention.

FIG. 7 shows that hierarchical interconnections and/or associations of component data-storage systems to which data objects are directed through logical bins may also be possible in various embodiments of the present invention. As shown in FIG. 7, data objects may be directed through a number of logical bins 702-706 to a small number of component data-storage systems 710 and 712 that directly receive data objects through the logical bins. The receiving component data-storage systems 710 and 712 may, in turn, direct data objects to some larger number of secondary component data-storage systems 716-721. Hierarchically organized component data-storage systems can provide greater flexibility and robustness, and further insulate the routing methods employed within a distributed, differential electronic-data storage system from the actual component data-storage systems to which data objects are directed through logical bins. In still alternative embodiments, logical bins may be hierarchically organized.

Differential-Data-Storage Compression and Differential-Data-Storage Metrics Used For Evaluating the Efficiency of Differential Data-Storage Systems FIGS. 8A-B illustrate the difference between a differential data store and a non-differential data store. FIGS. 8A-B and subsequent figures represent the memory required to store or transmit a data object as the area of a simple geometrical figure. In FIG. 8A, two data objects 802 and 804 with sizes corresponding to the areas of the squares used to represent the data objects 802 and 804 are received by a non-differential data store, which stores the two received data objects in an amount of memory 806 equivalent to the sum of the sizes of the two data objects 802 and 804, plus some small additional memory overhead 808 needed for indexing and managing the data objects. By contrast, as shown in FIG. 8B, a differential data store receives two data objects 810 and 812 and stores the two data objects in an amount of memory 814 less than the sum of the sizes of the two received data objects 810 and 812. The cross-hatched portion of the representation of the memory in which the two data objects are stored 816 represents redundant information detected by the differential data store within the two received data objects and stored only once for both data objects, rather than once for each data object. As with the non-differential data store, a differential data store also incurs a small additional overhead 818 of memory in order to index and manage the two stored data objects. Thus, a differential store generally can detect redundancy between a received data object and an already stored data object in order to more efficiently store the received data object. Differential data storage is one form of data compression.

In general, an individual data object may contain a significant amount of redundant information, and may therefore be compressed individually. FIGS. 9A-B show a more general case in which data objects are compressed individually as well as by differential-data-storage compression. A non-differential store may first compress each of the two received data objects 902 and 904 and store the two compressed data objects in a total memory space 906 equal to the sum of the sizes of the compressed data objects 908 and 910, respectively, plus an additional overhead 912. By contrast, a differential data store, as shown in FIG. 9B, may first compress received data objects 914 and 916, and may nevertheless store the two compressed data objects in a memory space 918 smaller than the sum of the memory sizes of the two compressed data objects, with an additional overhead 920. The cross-hatched section 922 of the memory-space representation 918 represents redundant information detected by the differential data store in the two compressed data objects, which is stored once, when the first data object is stored, but not again stored when the second data object is stored. In subsequent discussions, figures such as FIG. 8A-B are used to indicate differential-data-store efficiencies, whether the differential data-store deficiencies arise from detecting redundancy between uncompressed data objects or compressed data objects. In other words, the additional detail needed to depict both compression arising from differential data storage of multiple objects as well as from compression of individual objects is avoided, for the sake of clarity. It is assumed that the compression achieved by differential storage of data objects is in addition to compression achieved by individually compressing data objects prior to submitting the data objects to the differential data-storage system.

Figure 10:
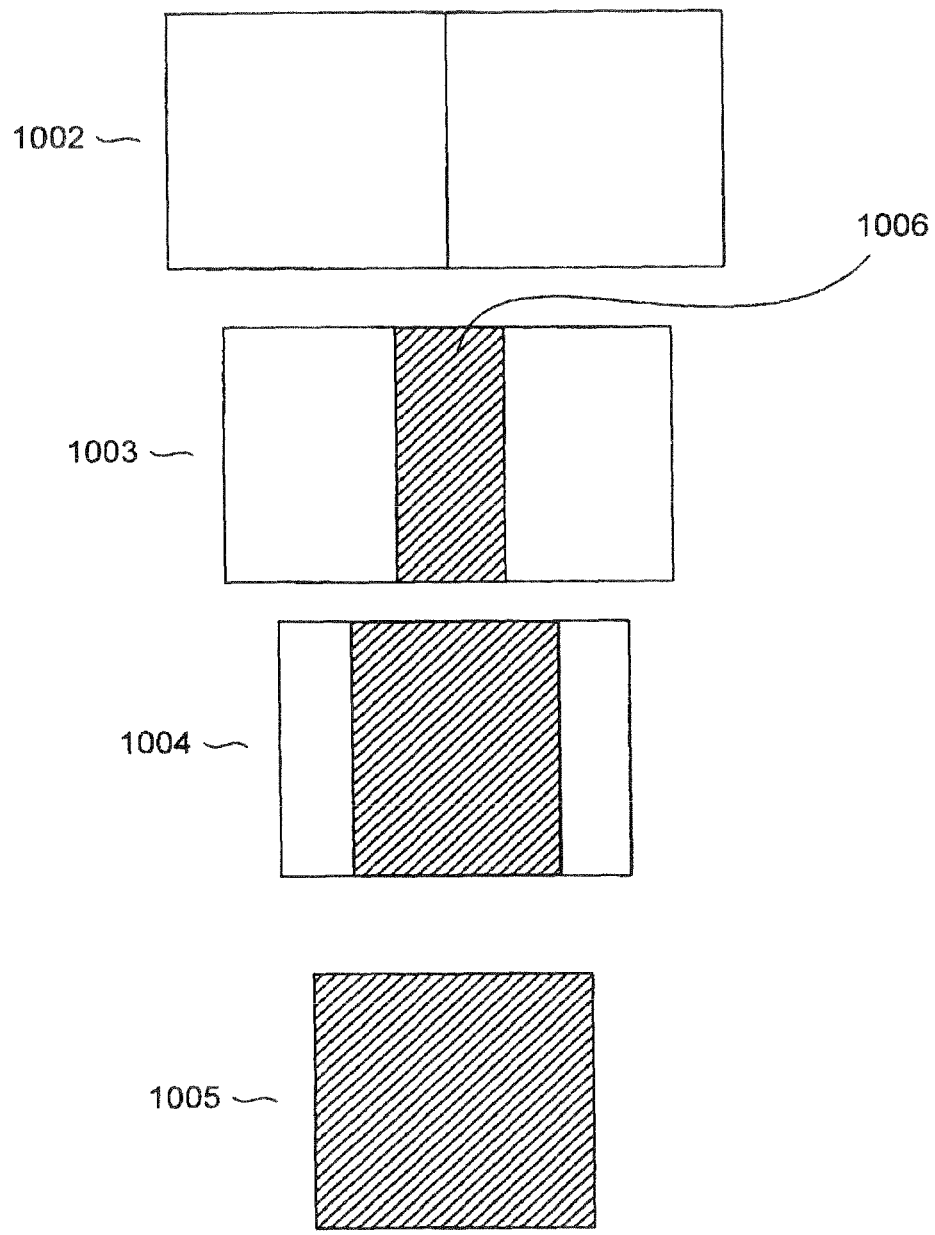
FIG. 10 illustrates various levels of compression possible in a differential data-storage system.

FIG. 10 illustrates various levels of compression achieved for differential storage of two data objects in a differential data-storage system. FIG. 10 uses the same illustration conventions used in FIGS. 8A-B and 9A-B. FIG. 10 shows four memory representations 1002-1005 of the memory needed to differentially store two data objects at four different levels of compression. The first memory area 1002 has a size equal to the sum of the sizes of the individual data objects. In this case, no differential-data-storage compression is obtained by the differential data-storage system, and the storage of the two data objects is equivalent to storage in a non-differential data-storage system. In the second memory area 1003, a relatively small amount of redundant data is detected within the two data objects, indicated by the cross-hatched, overlap area 1006 shown within the memory area, so that the differential data-storage system stores the two objects in memory of size equal to the sum of the memory sizes of the two data objects minus the size of the redundant data detected within the two data objects. In other words, only a single copy of the redundant data is stored when the second of the two data objects is stored. The memory area 1004 shows a larger level of compression obtained in storing two data objects, and the final memory area 1005 shows storage of two identical data objects by a differential data-storage system in a memory within the differential data-storage system equal to the size of one of the two identical data objects. A co-compression metric can be used to numerically quantify the degree of compression achieved for two data objects stored within a differential data-storage system, the compression metric mathematically represented as follows:

$$CCM_{O_1,O_2} = \frac{DSI(O_1, O_2)}{DSI(O_1) + DSI(O_2)}$$

where $O_1$ and $O_2$ are the two data objects; and
DSI( ) is a function that returns the size of the memory needed to store all object arguments in a differential data-storage system in the order specified in the argument list.

This co-compression metric may range from ½, for perfect differential-data-storage compression, to 1, essentially non-differential data storage of the two data objects. This range ignores overhead associated with data-object storage, and non-differential-data-storage compression of the data objects. An alternative co-compression metric that ranges from 0 to 1, with 1 indicating a highest level of compression, can be formulated as follows:

$$CCM_{O_1,O_2} = 2\left[1 - \left(\frac{DSI(O_1, O_2)}{DSI(O_1) + DSI(O_2)}\right)\right]$$

Figure 11:
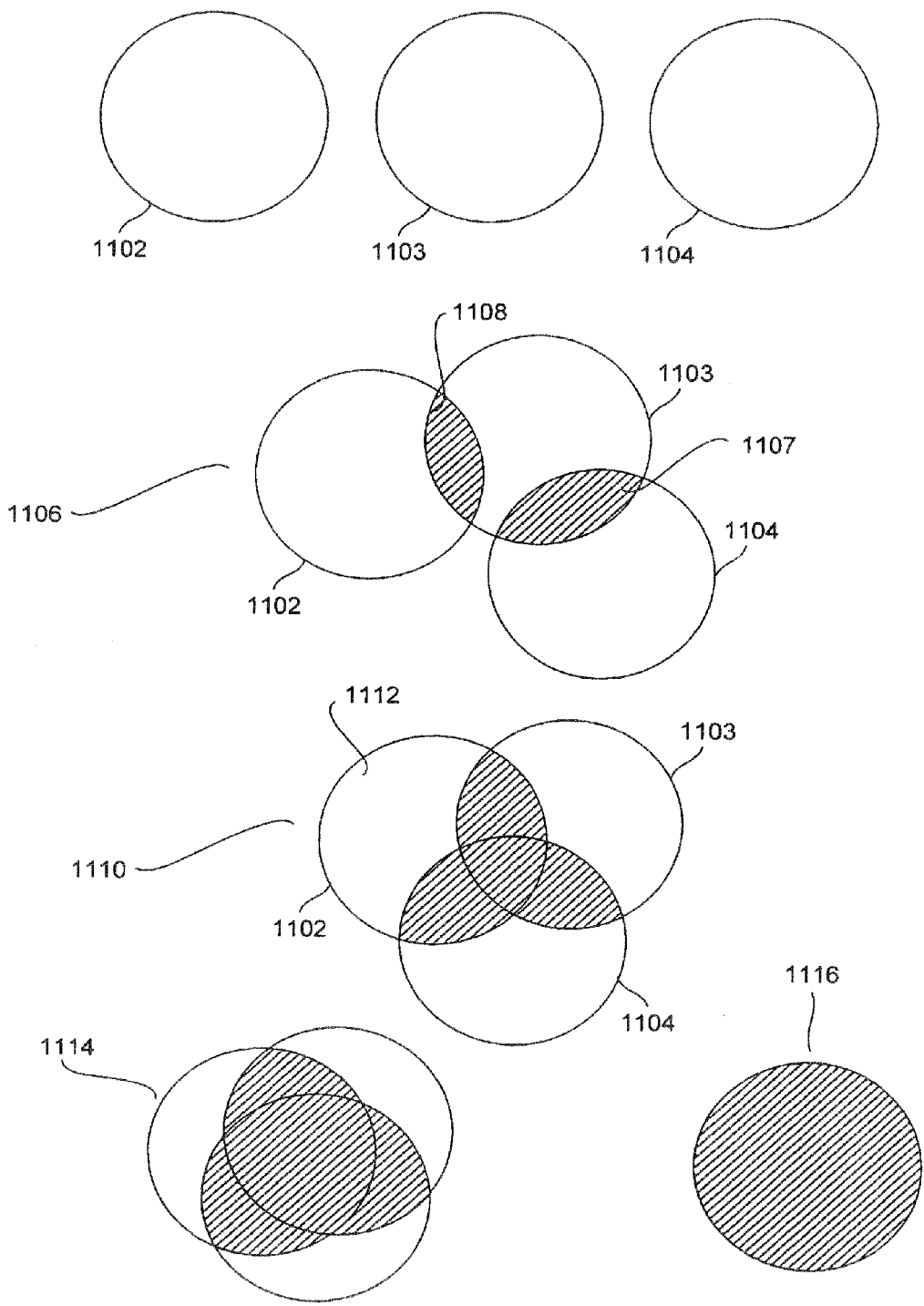
FIG. 11 illustrates varying degrees of compression possible for storing different types of data objects in different types of differential data-storage systems.

Many other metrics co-compression metrics are possible, including co-compression metrics with values that range from 0 to 1, Certain distributed, differential electronic-data storage systems may achieve increasingly greater levels of differential-data-storage compression per object when storing more than two data objects, while others may achieve only the pair-wise compression levels discussed above with reference to FIGS. 8A-10. FIG. 11 illustrates varying degrees of compression possible for storing multiple data objects in different types of differential data-storage systems. In FIG. 11, three data objects are illustrated by open circles 1102-1104. When stored in a non-differential-data-storage system, the memory occupied by the three stored data objects would be equal to the sum of the sizes of the three data objects. In certain differential data-storage systems, redundancies between a currently received data object and only a single, stored data object may be detected and removed by differential data-storage compression. For example, in the first combined memory area 1106 shown in FIG. 11, data object 1103 is first stored. Next, data object 1104 is stored, and the data redundancy between data objects 1104 and 1103 is recognized so that only a single copy of the redundant information 1107 needs to be stored, resulting in the two data objects occupying memory of a size less than the combined sizes of the two data objects 1103 and 1104. Next, data object 1102 is stored. In certain differential data-storage systems, redundancy between data object 1102 and only one other, already stored data object can be detected and differentially compressed. As shown in FIG. 11, the redundancy between data object 1102 and already stored data object 1103-1108 is detected, so that the memory space required to store data objects 1102 and 1103 is less than the combined sizes of data objects 1102 and 1103. In other types of differential data-storage systems, additional redundancy can be detected and differentially compressed. In the second combined memory area 1110 shown in FIG. 11, redundancies between a given data object to be stored and all previously stored data objects is detected and differentially compressed. Thus, first-stored data object 1103 is stored in its entirety. Only the portion of next-stored data object 1104 that does not overlap with data object 1103 is stored, and, finally, the non-cross-hatched portion 1112 of data object 1102 is stored, since the cross-hatched portions of data object 1102 are redundant with the data already stored for data objects 1103 and 1104. As the redundant information shared between the three data objects increases, the size of the memory required to store the three objects in such differential data-storage systems decreases, as shown in the combined memory-storage space 1114. When all three data objects are identical, as shown in combined data storage space 1116, a 1:3 compression ratio may be obtained in the most efficient differential data-storage systems.

Figure 12:
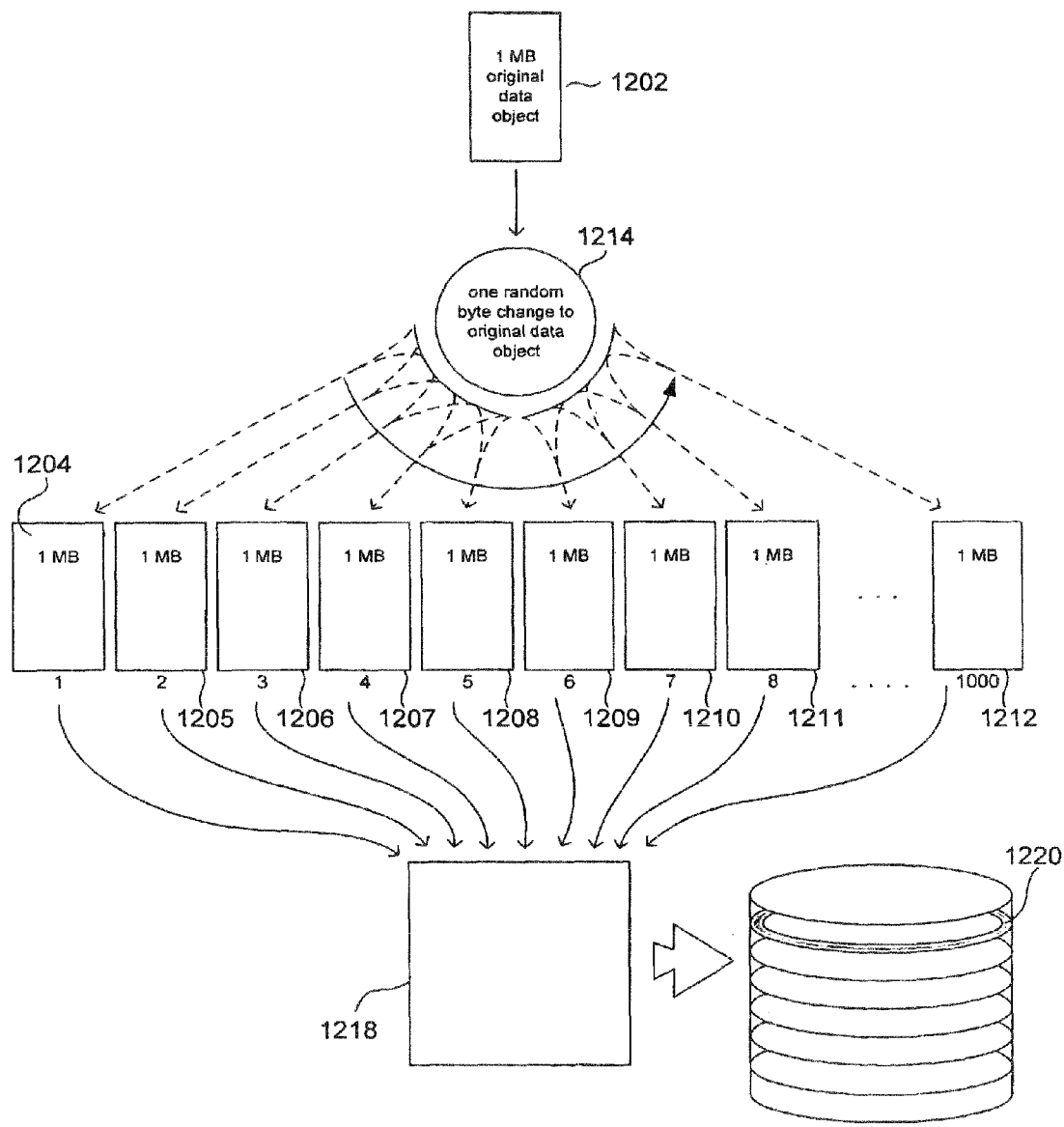
FIG. 12 illustrates a method for determining the efficiency of a differential data-storage system according to various embodiments of the present invention.

FIG. 12 illustrates a method for determining the efficiency of a differential data-storage system according to various embodiments of the present invention. First, a 1-megabyte original data object 1202 is generated by a random data-generation system. Next, 1000 data objects 1204-1212 are generated from the original data object 1202 by making 1000 successive, random, one-byte changes 1214 to the original data object 1202. The 1000 memory objects 1204-1212 are then stored in a differential data-storage system 1218, and the size of the memory 1220 used to store the 1000 data objects is determined. The efficiency of the differential data-storage system 1218 is computed as one minus the ratio of the memory used to store the 1000 generated data objects 1220 divided by 1000 megabytes, or:

$$\text{efficiency} = 1 - \left[\frac{DSI(O_1, O_2, O_3, \ldots, O_{1000})}{1000\ MB}\right]$$

where DSI( ) returns the memory needed to store the data objects in units of megabytes.

Compression-Enhancing Routing

Figure 13:
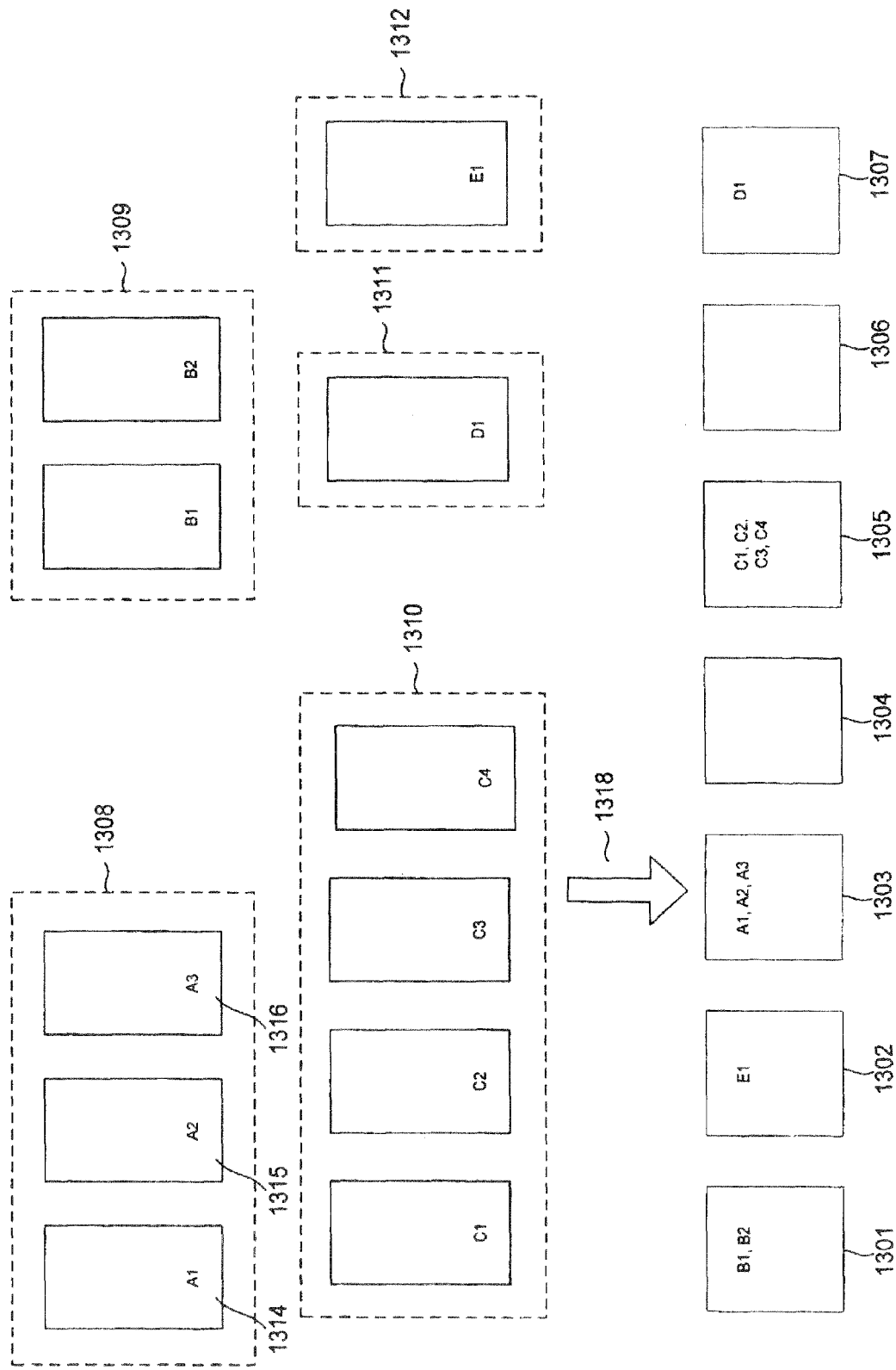
FIG. 13 illustrates several desired properties for routing data objects to individual electronic-data-storage components within a distributed, differential electronic-data storage system that represent embodiments of the present invention.

FIG. 13 illustrates several desired properties for routing data objects to individual component data-storage systems or particular groups of component data-storage systems within a distributed, differential electronic-data storage system that represent embodiments of the present invention. FIG. 13 shows a distributed, differential electronic-data storage system comprising 7 component data-storage systems 1301-1307. In FIG. 13, five groups 1308-1312 of related, or similar, data objects are shown within dashed rectangles. For example, the first data-object group 1308 includes the three data objects A1 1314, A2 1315, and A3 1316. The data objects within each group are similar, or, in other words, share a certain amount of data, and are therefore compressible when stored together or successively stored on a particular component data-storage system, while the data objects within one group are dissimilar with respect to the data objects in the other groups, and offer no particular opportunity for data compression by virtue of being stored together. For example, a component data-storage system can generally store similar data objects A1, A2, and A3 in less data-storage space than the sum of the data-storage spaces needed to individually store data objects A1, A2, and A3. However, a component data-storage system generally stores dissimilar data objects A1 and B1 using a data-storage space approximately equal to the data-storage spaces needed to individually store data objects A1 and B1. Therefore, in the class of distributed, differential electronic-data storage systems in which entire data objects are stored within individual component data-storage systems or groups of component data-storage systems, the greatest level of compression, or removal of data redundancy, can be achieved when similar data objects are collocated within individual component data-storage systems or particular groups of component data-storage systems.

In FIG. 13, the arrow 1318 represents routing of data objects to individual component data-storage systems 1301-1307. For greatest overall data compression, as shown in FIG. 13, the routing method 1318 directs each data object within a group of similar data objects to a single component data-storage system. For example, all of the data objects A1, A2, and A3 in the first group of similar data objects 1308 are routed to component data-storage system 1303.

While routing of similar data objects to the same component data-storage system is desirable for maximizing the data compression of a distributed, differential electronic-data storage system, overall data-storage efficiency is increased by relatively uniformly distributing data objects across all of the component data-storage systems. In other words, when each component data-storage system stores an approximately equal volume of data, the overall storage capacity of the distributed, differential electronic-data storage system can be most efficiently used. Otherwise, certain of the component data-storage systems may be filled to maximum capacity while other of the component data-storage systems may remain idle, requiring expensive data redistribution operations or equally expensive and inefficient addition of additional component data-storage systems in order to increase capacity of the distributed, differential electronic-data storage system, even though certain of the component data-storage systems are not storing data. Thus, as shown in FIG. 13, a desirable routing method and system 1318 spreads the different, dissimilar groups of data objects 1308-1312 relatively uniformly across the component data-storage systems 1301-1307.

In many distributed, differential electronic-data storage systems, it is not necessary that all similar data structures are successfully routed to a single component data-storage system, and it is also not necessary that data be stored in a way that guarantees absolute, uniform distribution of data across all the component data-storage systems. Instead, quality of routing may range from random assignment of data objects to component data-storage systems, regardless of similarity between data objects to ideal collocation of all similar data objects, and may range from non-uniform distribution of data within a distributed data-storage system to an ideal, uniform distribution in which each component data-storage system stores the same volume of data, within the granularity of a minimum data object size. In general, as with most computational systems, there are processing-overhead, communications-overhead, and memory-usage tradeoffs among various approaches to routing, and the closer a routing system approaches ideal uniform data distribution and ideal similar-data-object collocation, the greater amount of processing, memory, and communications resources that may be needed to execute the routing system. In many cases, it is desirable to somewhat relax distribution and collocation requirements in order to increase the speed and efficiency by which data objects are routed. The various embodiments of the present invention represent a favorable balance between routing speed and computational efficiency versus uniformity of data distribution and the degree to which similar data objects are collocated.

It should be noted that, in general, data objects are supplied to a distributed, differential electronic-data storage system serially, one-by-one, so that the distributed, differential electronic-data storage system needs to route data objects to component data-storage systems without the benefit of global information with respect to the data objects that are eventually stored within the distributed, differential electronic-data storage system. Moreover, as additional data objects are stored, and already stored data objects are deleted, the data state of a distributed, differential electronic-data storage system varies dynamically, often in a relatively unpredictable fashion. Therefore, strategies for routing data to achieve uniformity of data distribution and collocation of similar data objects are often unavoidably non-optimal. Furthermore, because routing may represent a significant bottleneck with respect to data-object exchange between a distributed, differential electronic-data storage system and accessing host computer systems, router efficiency and routing speed may be limiting factors in overall system performance. It should also be noted that data-object similarity may be measured in many different ways, subgroups of which are relevant to different compression techniques and differential-store strategies employed by different distributed, differential electronic-data storage systems. The method and system embodiments of the present invention assume the similarity between two data-objects to be correlated with the number of identical, shared subsequences of data units contained within the two data objects.

Content-Based Compression-Enhancing Routing Methods

Figure 14:
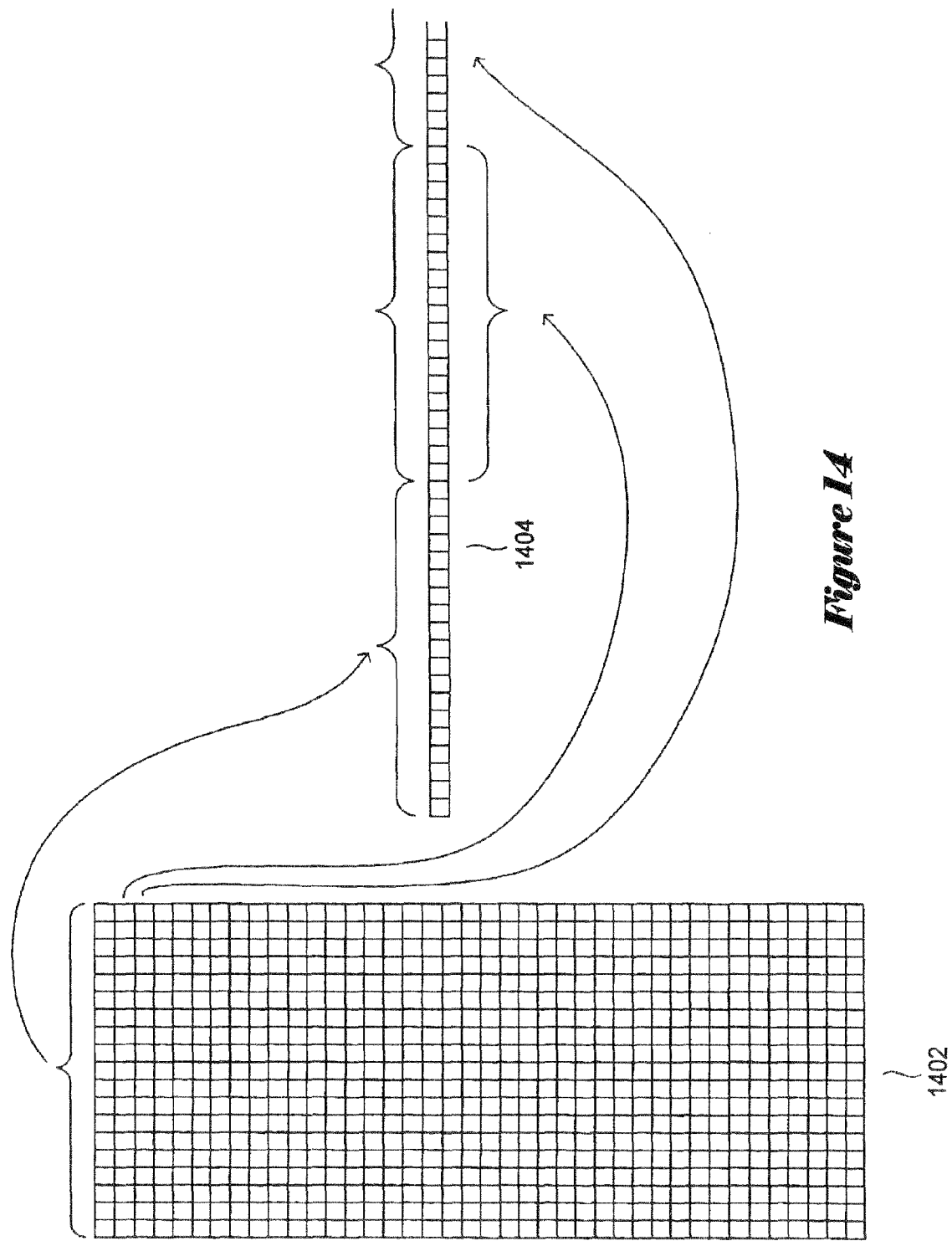
FIG. 14 illustrates a generalized data object routed by method and system embodiments of the present invention.

FIG. 14 illustrates a generalized data object routed by method and system embodiments of the present invention. As shown in FIG. 14, a data object 302 is often considered to be a two-dimensional array of data units. Types of data objects that fit this conceptualization include text documents, digitally encoded photographs, various types of computer-generated data, digitally encoded software programs and executable files, and many other types of data objects. Such data objects can be alternatively viewed as a single, very long, linear array 1404 of ordered data units, with the order of data units in the array 1404 determined by a deterministic mapping function that maps the two-dimensional array of data units to a single, linear array of data units, and, in fact, are normally stored and manipulated in this fashion by computer hardware and software. For example, as shown in FIG. 14, the lines of a text file may be successively stored in the linear array, line-by-line, to generate a single sequential array of text symbols. In general, regardless of the logical topology of a data object, a data object can be mapped to a single, sequentially ordered, linear array of data units. Data units may include bytes, 16-bit characters, 32-bit integers, or any other convenient primitive data unit into which a data object can be decomposed.

Figure 15A:
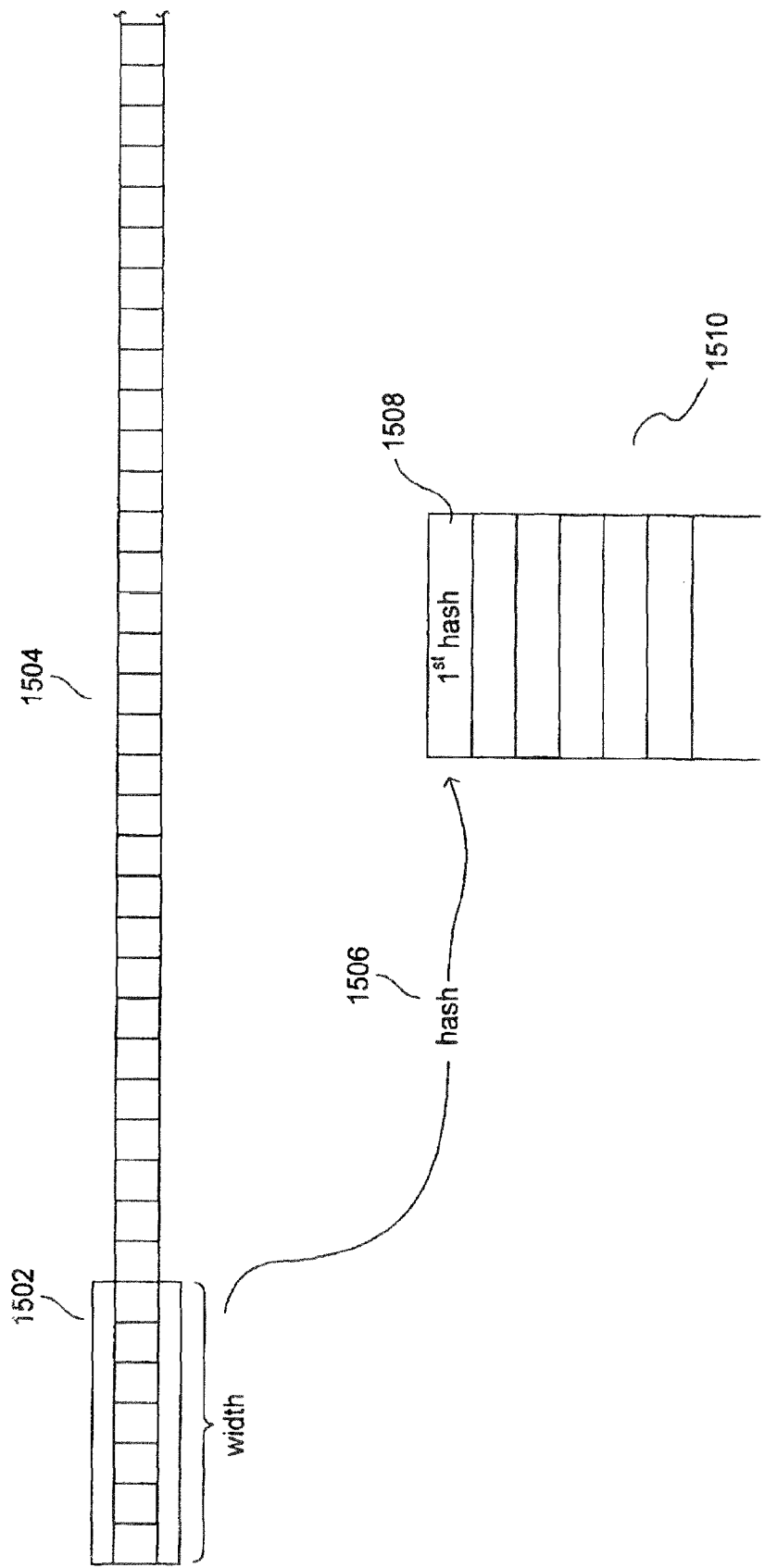
FIGS. 15A-D illustrate a general routing-method embodiment of the present invention.

Assuming data objects to be sequentially ordered, linear arrays of data units, method and system embodiments of the present invention process the data objects in order to first generate a digitally-encoded value, or similarity key, such as a large integer, that is generally much smaller than the data object, in order to represent or characterize the data object. Then, in a second step, method and system embodiments of the present invention, typically using modulo arithmetic, generate a component data-system index or address for directing the data object represented or characterized by the digitally encoded value to a particular component data-storage system or group of data-storage systems. FIGS. 15A-D illustrate a general routing-method embodiment of the present invention. As shown in FIG. 15A, a relatively small window 1502 of successive data units within the linear array representing the data object 1504, generally left-justified with the first data unit in the array 1504, is first considered. The window has, in many embodiments, a fixed width. For example, in FIG. 15A, the window 1502 has a width of seven data units. A procedure or function is used to generate a digitally-encoded value based on the data-unit contents of the window. In general, such functions are referred to as hash functions 1506. Hash functions generate the same, unique number for each instance of a window containing identical data-unit values or is, in other words, repeatably deterministic. The hash values generated for two data windows containing one or more different data-unit values are generally different. However, viewing the contents of the data window as encoding a large binary number, since the larger number of possible data-window values are mapped to a smaller number of possible hash values, hash functions unavoidably produce collisions in which two windows containing differently valued data units generate the same hash value. There are many different types of hash functions with different distribution characteristics. These classes of hash functions may be more or less useful for data-object routing within distributed, differential electronic-data storage systems depending on expected distributions of, and types of, data objects stored within the systems. Selection of hash functions appropriate for particular data-object-routing problems is beyond the scope of the present application. However, collision-resistant hash functions and similarity-preserving hash functions within the family of hash functions referred to as "cryptographic hash functions" are often used to good effect for data-object routing. Once a hash value has been generated 1506 from the data-unit contents of the data window 1502, the hash value is stored in a first entry 1508 of an array of hash values 1510.

Figure 15B:
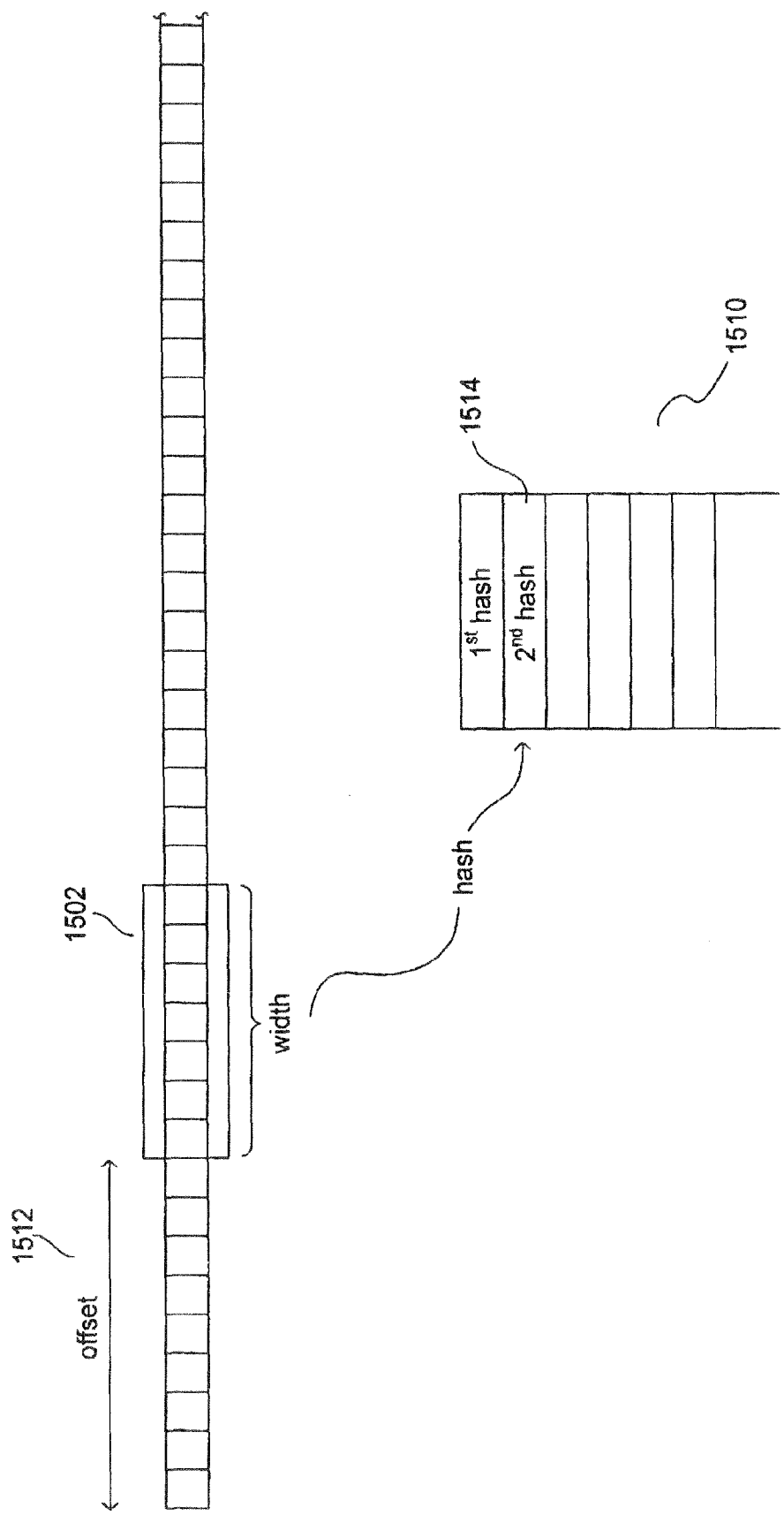
Figure 15C:
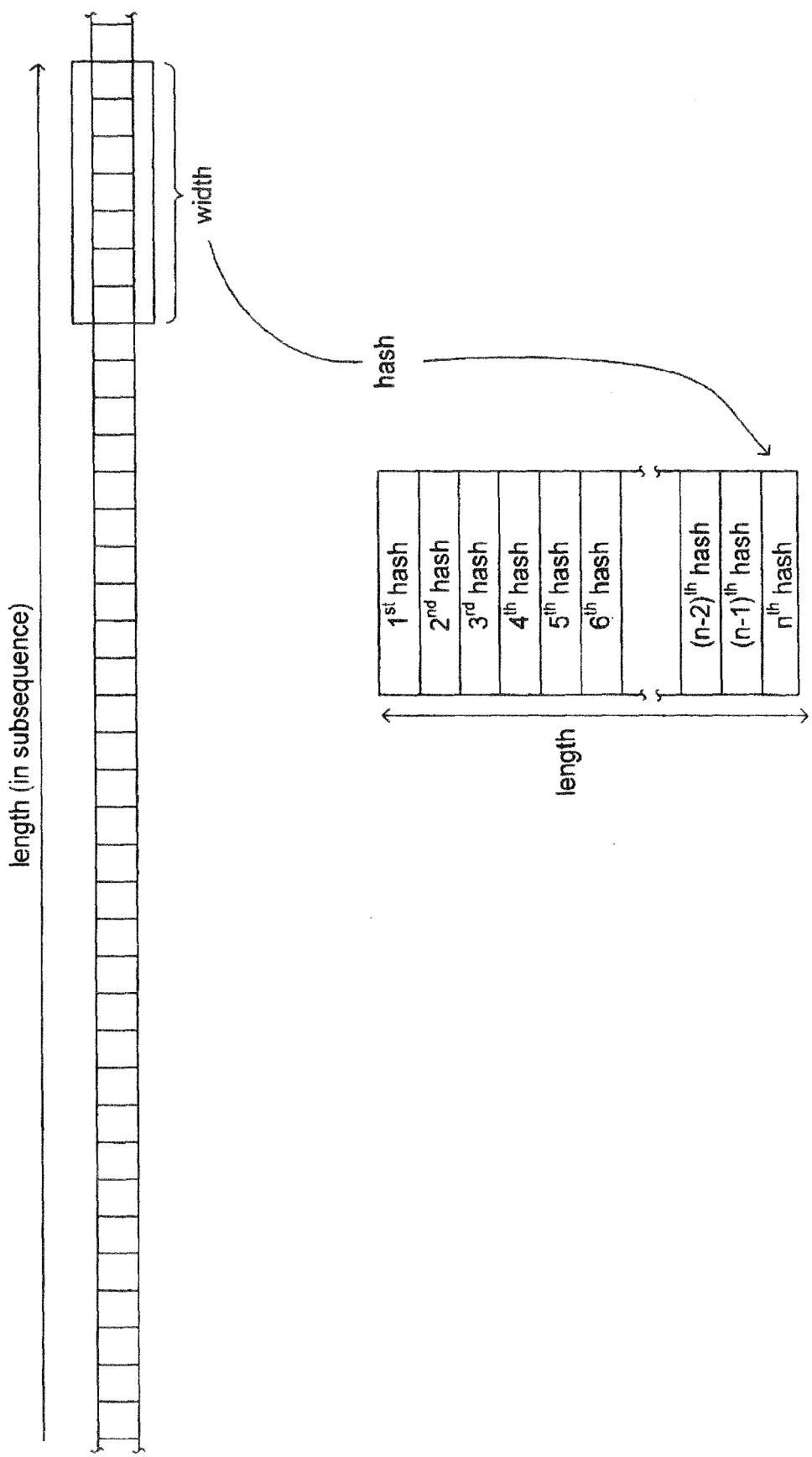

Next, as shown in FIG. 15B, the window 1502 is displaced from the initial position of the window, shown in FIG. 15A, by some number of data units referred to as an offset 1512. The new data-unit contents of the data window, following displacement of the data unit by the offset, are provided to the hash function to generate a second hash value which is stored in the second entry 1514 of the array of hash values 1510. The process of displacing the window by the offset and computing a next hash value continues until a number of hash values, referred to as the "length," have been generated, as shown in FIG. 15C. The length may be measured either in terms of the number of hash values generated, or in terms of the number of data units traversed in the window-displacement and hash-value-computation method illustrated in FIGS. 15A-C. The length may be equal to the total possible number of hash-value-generation steps over the linear-array representation of the data object, or may be a smaller number. When the offset is equal to or greater than the window width, each window of data units is often referred to as a "chunk." Conversely, when the offset is one data unit, the series of overlapping windows obtained by the above-described method are often referred to as n-grams. In certain embodiments of the present invention, the window width may vary during the process, producing variable-sized chunks, in the case of non-overlapping windows, from which hash values are generated. The offset, width, and length parameters may be fixed or may vary, in general, in the range of possible implementations of various embodiments of the present invention.

Figure 15D:
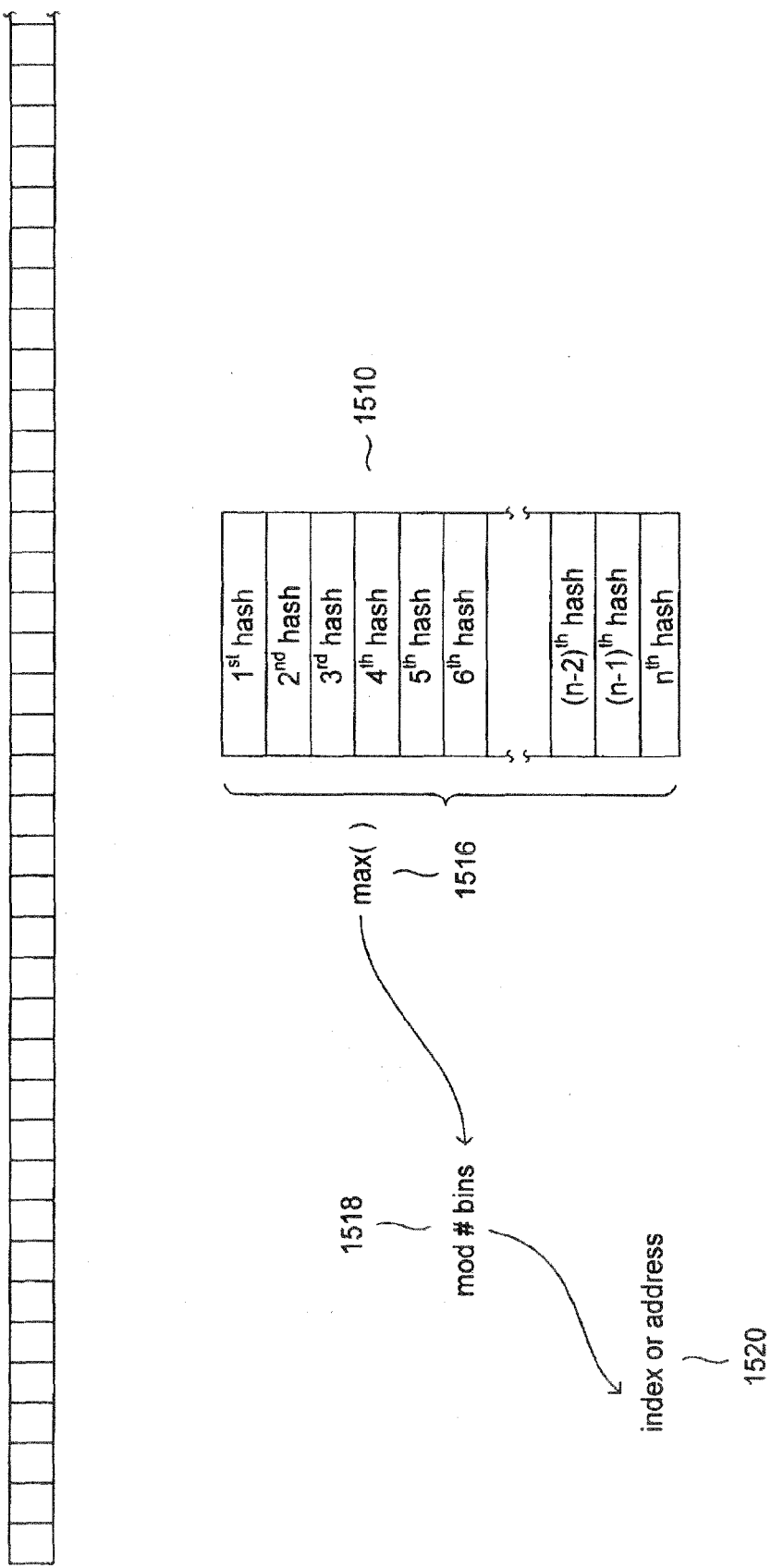

Next, as shown in FIG. 15D, a function 1516 is used to select one of the hash values from the hash-value array 1510, and the selected hash value is then used in an arithmetic operation 1518 to generate the index or address of a component data-storage system 1520. In the example shown in FIG. 15D, the function used to select a single hash value from the array of hash values is the max( ) function, which selects the hash value with largest numerical value. Alternatively, the smallest valued hash value may be selected in alternative embodiments, or a function that arithmetically computes a single characteristic value based on two or more hash values stored in the hash-value array may also be used in alternative implementations. In the example shown in FIG. 15D, the remainder of integer division of the selected or computed characteristic value by the number of component data-storage systems is used to generate a component data-storage-system index. In alternative embodiments, any of an almost limitless number of different mappings between computed values or hash values to component data-storage-system addresses or indexes may be employed. In still additional embodiments, a number k of the generated hash values may be selected for computation of one or more characteristic values, and the one or more characteristic values may be combined and arithmetically processed to generate one or more indexes, used to identify one or a number of component data storage systems.

FIG. 16 abstractly illustrates data-object routing by methods of the present invention. A data object 1602 is processed by the routing method of the present invention 1604, as discussed above with reference to FIGS. 4A-B, to generate a component data-storage system address or index in order to direct the data object 1602 to a particular component data-storage system 1608 from among all of the component data-storage systems 1607-1613 that together compose a distributed, differential electronic-data storage system. Alternatively, the index or address may be used to direct the data object to a particular group of hierarchically arranged component data-storage systems. The data object 1602 is then transmitted to the selected component data-storage system 1608 for storage 1616.

The generalized routing method discussed above with reference to FIGS. 15A-D is characterized by three different parameters: (1) width, the width of the window of data units used to generate each hash value; (2) offset, the number of data units by which successive window placements are displaced from one another within the linear array of data units that represent the data object for successive hash-value computations; and (3) length, the number of hash values generated from which a single characteristic value is selected or computed. In many embodiments of the present invention, these three characteristics, or parameters, have fixed values. However, in alternative embodiments and implementations, any one or more of the parameters may have regularly varying values. For example, the offset could be increased by a fixed amount after generation of each hash value. In another example, the length may vary with the size of the data object, so that up to a length number of hash values is generated for each data object. In yet another example, the window size may regularly vary as hash values are generated.

Two particular routing schemes, representing particular fixed parameter values, are of particular interest. In the max-chunk method, offset is equal in value to width, so that the successive windows form a series of consecutive chunks along the linear-array representation of the data object. In this method, the maximum hash value generated from any particular chunk may be selected as the value characteristic of the data object, and a component data-storage address may be computed based on this maximum hash value. Alternatively, the minimum hash value may be selected, or some other value may be computed from the hash values generated from the chunks. In the n-gram routing method, offset is equal to "1."Thus, hash values are generated for each successive window displaced from the preceding window by one data unit. The n data-units within each window, where n is equal to the width of the window, are considered to be an n gram, and the n-gram hash therefore computes a characteristic value based on examining all possible N grams within the data object.

In a family of distributed, differential electronic-data storage systems, objects are first chunked, and then stored as a set of chunks. One possible co-compression metric for differential-data-storage compression achievable by storing two data objects $O_1$ and $O_2$ in is a chunk-based distributed, differential electronic-data storage system is:

$$CCM_{O_1,O_2} = \frac{CountOf[hList(cks(O_1) \cup cks(O_2)) - hList(cks(O_1) \cap cks(O_2))]}{CountOf[hList(cks(O_1) \cup cks(O_2))]}$$

where the function hList produces a list of hashes for a set of chunks;

the function cks produces a set of chunks for a data object; and the function CountOf returns the number of elements in a set.

This compression metric ranges from 0, for perfect compression, to 1 when no differential-data-storage compression is obtained for the two objects.

Query-Based Compression-Enhancing Routing Methods

Figure 17:
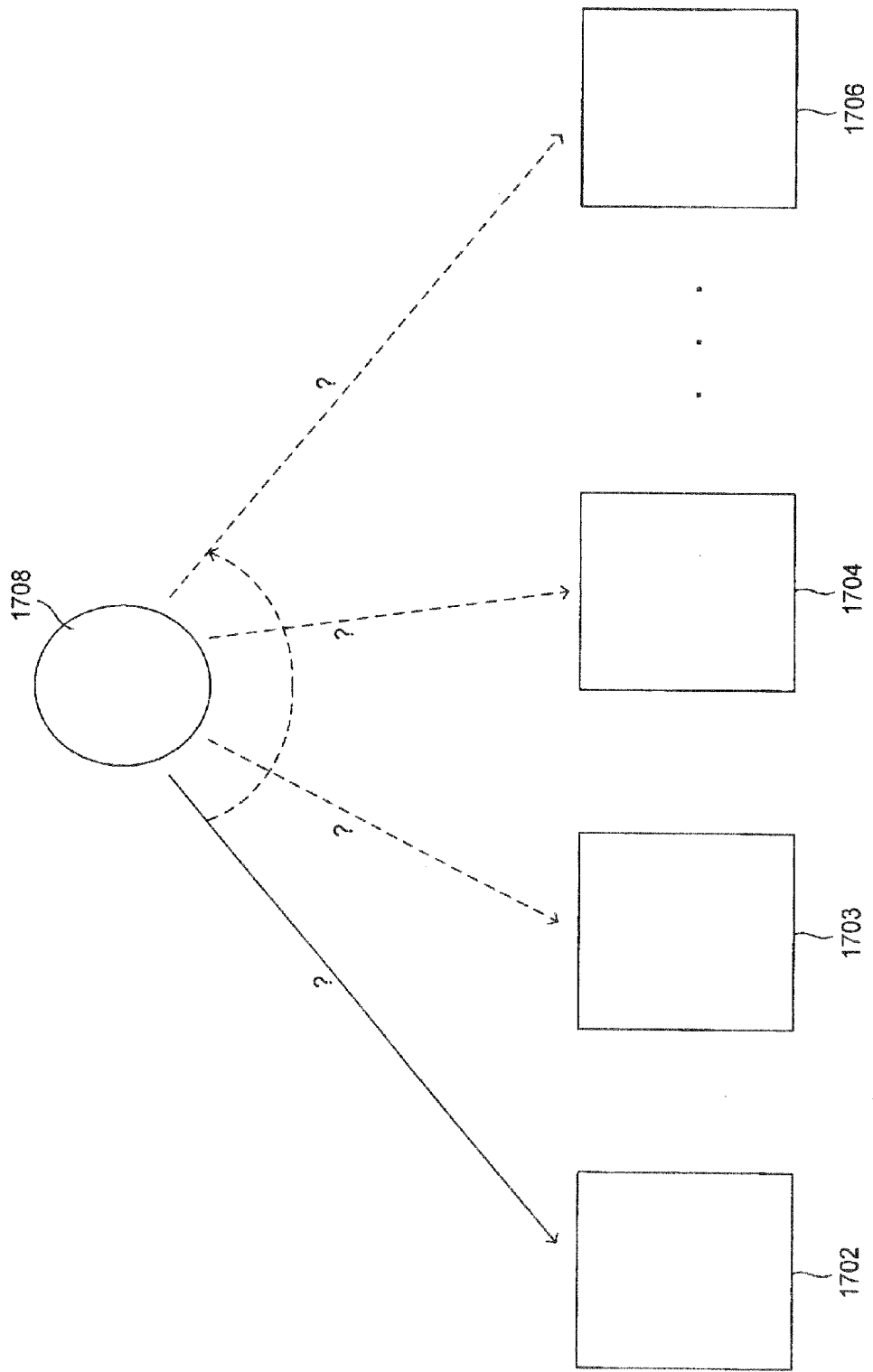
FIG. 17 illustrates the general query-based compression-enhancing routing method used in various embodiments of the present invention.

FIG. 17 illustrates a general query-based compression-enhancing routing method used in various embodiments of the present invention. FIG. 17 shows a number of component data-storage systems 1702-1706. In the general query-based routing method, a routing component 1708 of a distributed, differential electronic-data storage system receives a data object and queries each of the component data-storage systems to determine which of the component data-storage systems can store the data object with the highest level of differential-data-storage compression. The routing component 1708 evaluates the responses returned from the component data-storage systems and then routes the data object to the component data-storage system that can store the data object with greatest reported differential-data-storage compression for the data object.

Figure 18:
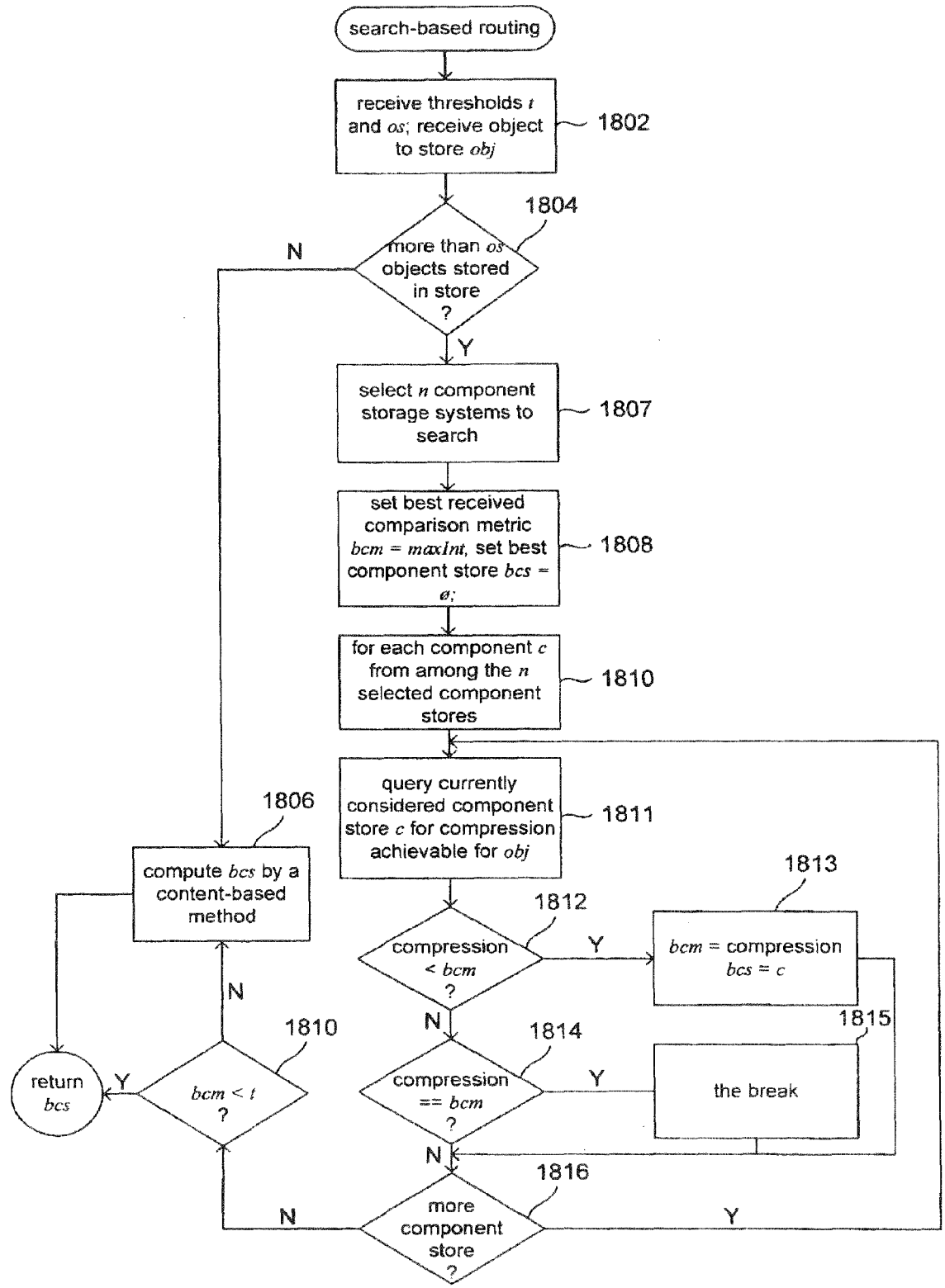
FIG. 18 is a control-flow diagram of the general query-based compression-enhancing routing method illustrated in FIG. 17 that represents a family of embodiments of the present invention.

FIG. 18 is a control-flow diagram for the general query-based compression-enhancing routing method illustrated in FIG. 17 that represents a family of embodiments of the present invention. In step 1802, the query-based routing method receives two thresholds: (1) t, a threshold of differential-data-storage compression needed for storing the data object on any component data-storage system; and (2) os, a threshold number of data objects needed to be previously stored within the distributed, differential electronic-data storage system to enable query-based routing. Also in step 1802, an object to be stored, obj, is received. If fewer than os objects have been stored in the distributed, differential electronic-data storage system, as determined in step 1804, then a content-based routing method, or other routing method, is employed, in step 1806, in order to select a component data-storage system to which to send the data object obj. Content-based routing methods include any of a family of content-based routing methods discussed above. Additional types of routing methods may also be used in step 1806, including round-robin routing, and other methods. Otherwise, the routing method selects n component data-storage systems to query for storing data object obj, in step 1807. In many cases, the routing method may elect to query each of the component data-storage systems within the distributed, differential electronic-data storage system. In other cases, the routing method may wish to query only a subset of the component data-storage systems, either for efficiency reasons, or based on knowledge of the prior routing of data objects to the component data-storage systems, statistical estimates of the most promising candidate component data-storage systems, or on other considerations.

Next, in step 1808, the routing method sets the best-received-comparison-metric variable bcm to some large value, such as maxInt, and sets the best-component-store variable bcs to some null value. A compression metric in which greatest compression is represented by 0 and lower levels of compression are represented by numerically increasing values is employed in the described embodiment, although other types of compression metrics may be used in alternative embodiments. Then, in the for-loop of steps 1810-1816, the routing method queries each component data-storage system c successively selected from the n component data-storage systems selected in step 1806. In step 1811, the currently considered data-storage system c is queried for the compression that can be achieved by the component data-storage system c in storing the data object obj. If the compression achievable by the currently considered component data-storage object c is greater than that indicated by the current value stored in variable bcm, as determined in step 1812, then, in step 1813, the variable bcm is updated to the compression level achievable by currently considered component data-storage object c and the variable bcs is set to c. Otherwise, if the compression achievable by component data-storage component c is equal to that indicated by the current value of variable bcm, as determined in step 1814, then a tie-breaking procedure may be invoked, in step 1815. A tie-breaking procedure may involve an additional, more detailed query, or may involve some arbitrary tie-breaking process. One arbitrating tie-breaking process is to eliminate step 1814 and 1815 and select the first component data-storage system that reports the maximum achievable compression rate obtained by querying the n component data-storage systems. If there are additional component data-storage systems to query, as determined in step 1816, then control flows back in step 1811. Otherwise, if the maximum compression achievable, represented by the metric stored in variable bcm, is greater than the threshold compression level t, as determined in step 1818, then the component data-storage system indicated by the value of the variable bcs is returned. Otherwise, a content-based or other non-query-based routing method is undertaken, in step 1806, in order to determine the component data-storage system to which to route data object obj.

Figure 19:
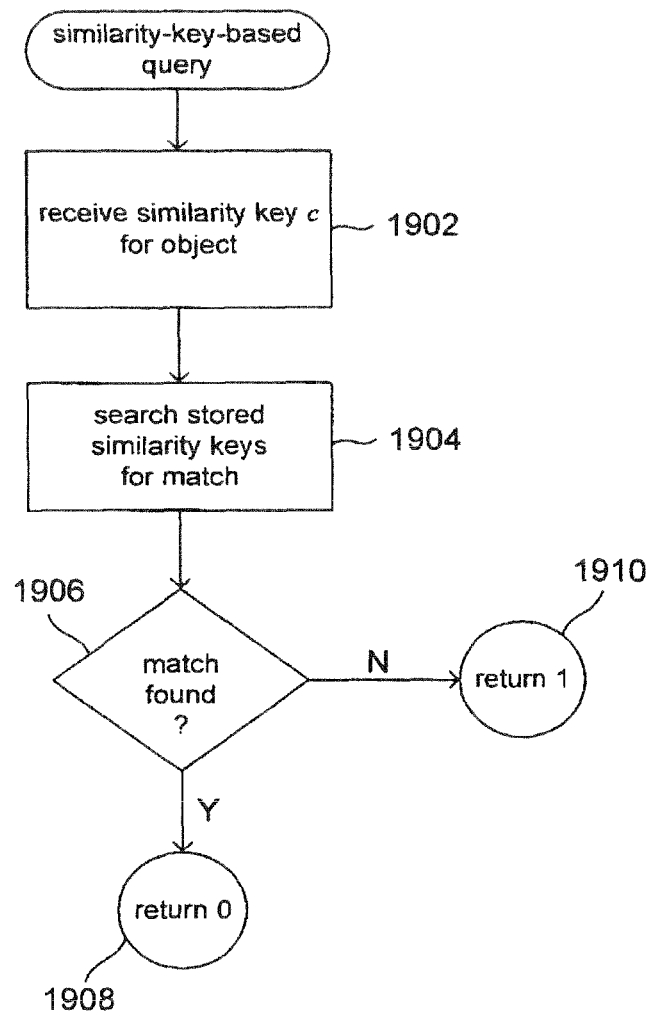
FIG. 19 is a control-flow diagram for similarity-key-based query-based routing according to various embodiments of the present invention.

FIG. 19 is a control-flow diagram for similarity-key-based query-based routing according to various embodiments of the present invention. FIG. 19 shows the steps undertaken by a component data-storage system upon receiving a query, in step 1811 of FIG. 18, under the similarity-key-based query-routing method. In step 1902, the component data-storage system receives a similarity key for a data object. In other words, the routing method, in step 1811 of FIG. 18, computes a similarity key for data object obj and forwards the similarity key to the component data-storage system as part of the query. In step 1904, the component data-storage system searches all the similarity keys stored within the component data-storage system for already stored data objects to determine whether or not the similarity key provided in step 1902 by the routing method matches any of the currently stored similarity keys. If a match is found, as determined in step 1906, then the value "0" is returned, in step 1908, to indicate good achievable compressibility. Otherwise, a value "1" is returned in step 1910 to indicate that no particular compressibility can be achieved. In alternative embodiments, a number of similarity keys for a given data object may be forwarded by the routing method, and the ratio of matched similarity keys to total similarity keys forwarded by the routing method may be returned as an indication of the compressibility achievable by the component data-storage system.

Figure 20:
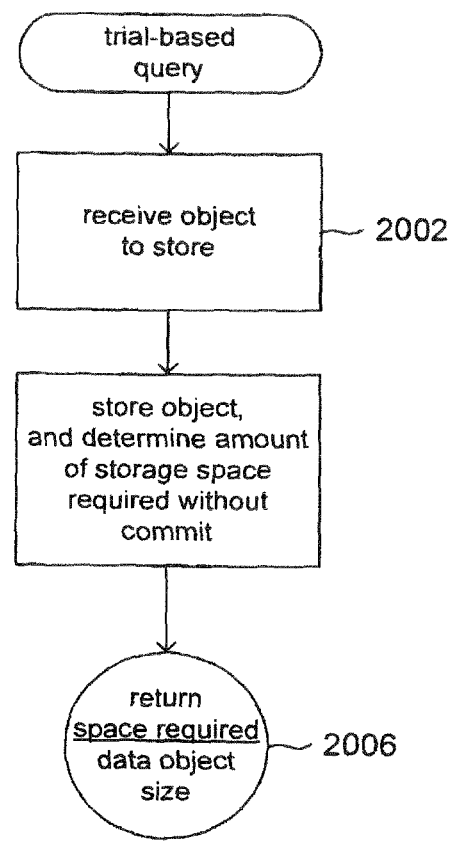
FIG. 20 is a control-flow diagram for a trial-based query method according to various embodiments of the present invention.

FIG. 20 is a control-flow diagram for a trial-based query method according to various embodiments of the present invention. In this method, the component data-storage system receives the data object obj forwarded from the routing method in step 2002. Then, the trial-based query method stores the object and determines the amount of storage space used by the storage object. In general, the object is stored, but not committed, so that the object can be later explicitly rolled back, or rolled back as a consequence of passage of time, should the routing method not elect to direct the object to the component data-storage system for storage. Finally, the component data-storage system returns the ratio of stored-data-object size to data-object size, in step 2006.

Figure 21:
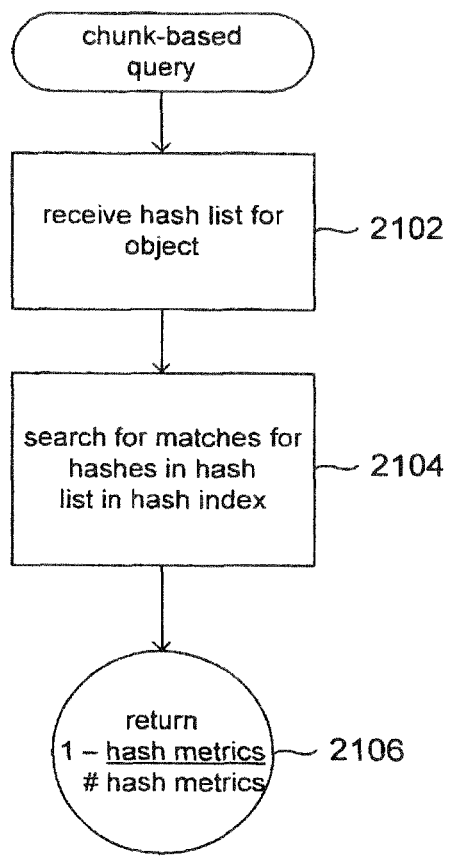
FIG. 21 illustrates a third, chunk-based query-based compression-enhancing routing method according to various embodiments of the present invention.

FIG. 21 illustrates a third, chunk-based query-based compression-enhancing routing method according to various embodiments of the present invention. In step 2102, the component data-storage system receives a hash list for a number of successive chunks of the data object computed by the routing method using a content-based-routing-like method in which the window width is equal to the offset. In other words, the routing method computes a hash value for each of a number of chunks within the data object, and sends a list of the computed hash values to the component data-storage system, in step 1811 of FIG. 18. In step 2104, the component data-storage system searches an index of hash values for chunks stored in the component data-storage system, and returns, in step 2106, the value:

$$CCM = 1 - \frac{\text{number of hash matches}}{\text{number of hash entries in received hash list}}$$

In alternative embodiments of chunk-based query-based compression-enhancing routing methods, some subset of hashes for the chunks within a data object may be sent to candidate component data-storage systems, such as a relatively small number of initial chunks, or the initial part of a list of hash values ordered by numerical value. Alternative compression metrics may be returned.

Although the present invention has been described in terms of a particular embodiment, it is not intended that the invention be limited to this embodiment. Modifications within the spirit of the invention will be apparent to those skilled in the art. For example, an essentially limitless number of different implementations of the query-based compression-enhancing routing methods of the present are possible, the implementations programmable in a variety of different programming languages, using alternative flow-control, data structures, modular organizations, targeted for execution on any number of different hardware platforms supporting various different operating systems. A wide variety of distributed, differential electronic-data storage systems that employ binning-based routing and compression-enhancing routing methods are also possible. Although a variety of different metrics have been provided, above, for evaluating the efficiency of distributed, differential electronic-data storage systems, a large number of alternative differential-data-storage-compression evaluating metrics may be devised. In query-based compression-enhancing routing, a single data object can be routed, or multiple, discrete data objects can be combined together for common routing. Alternatively, a single data object can decomposed into smaller, component data objects that can each be separately routed. While, in the above-discussed implementation, component data-storage systems return compression metrics in response to queries, component data-storage systems can alternatively return the memory required to store a data object or some other value or combination of values that allow a query-based compression-enhancing routing method to determine the level of compression achievable by storing the data object in the component data-storage system.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purpose of illustration and description. They are not intended to be exhaustive or to limit the invention to the precise forms disclosed. Obviously many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

What is claimed is:

1. A storage system comprising:
   a portal comprising a computer, wherein the portal is to:
      map logical bins to corresponding component data-storage systems that provide a distributed, differential data storage;
      receive data objects from at least one client computer; and
      direct the data objects through the logical bins to the component data-storage systems, wherein the portal is to direct the data objects to the component data-storage systems according to compression-enhancing routing that routes the data objects to the component data-storage systems based on determination by the portal of which of the component data-storage systems provides increased compression of each respective one of the data objects relative to another of the component data-storage systems,
      wherein the compression-enhancing routing comprises selecting, for storage of a particular one of the data objects, a component data-storage system from among the component data-storage systems, based on comparing levels of compression that can be obtained by storing the particular data object in the component data storage systems, wherein the selection of the component data-storage system for storage of the particular data object is based on selecting the component data-storage system that is able to achieve a higher level of compression.

2. The storage system of claim 1, wherein the compression-enhancing routing stores groups of the data objects on respective individual ones of the component data-storage systems to allow compression of each of the groups of the data objects at the respective individual component data-storage system.

3. The storage system of claim 2, wherein the compression of each of the groups of the data objects involves differential storing of the data objects of each group that removes redundant copies of data in the data objects of the corresponding group.

4. The storage system of claim 1, wherein the portal is to direct data objects through plural ones of the logical bins to a single one of the component data-storage systems.

5. The storage system of claim 1, wherein the portal is to direct data objects through a single one of the logical bins to plural ones of the component data-storage systems.

6. The storage system of claim 1, wherein in response to removal of one of the component data-storage systems, the portal is to:
   redirect logical bins initially mapped to the removed component data-storage system to one or more other of the component data-storage systems; and
   copy data objects stored in the removed component data-storage system to the one or more other component data-storage systems.

7. The storage system of claim 1, wherein the compression-enhancing routing is a query-based compression-enhancing routing in which the portal queries the component data-storage systems to obtain information regarding degrees of compression of the data objects at the corresponding component data-storage systems.

8. A method comprising:
- mapping, by a portal having a computer, logical bins to corresponding component data-storage systems that provide a distributed, differential data storage;
- receiving, by the portal, data objects from at least one client computer; and
- directing, by the portal, the data objects through the logical bins to the component data-storage systems, wherein the portal directs the data objects to the component data-storage systems according to compression-enhancing routing that routes the data objects to the component data-storage systems based on determination by the portal of which of the component data-storage systems provides increased compression of each respective one of the data objects relative to another of the component data-storage systems,
- wherein the compression-enhancing routing comprises selecting, for storage of a particular one of the data objects, a component data-storage system from among the component data-storage systems, based on comparing levels of compression that can be obtained by storing the particular data object in the component data storage systems, wherein the selection of the component data-storage system for storage of the particular data object is based on selecting the component data-storage system that is able to achieve a higher level of compression.

9. The method of claim 8, wherein the compression-enhancing routing stores groups of the data objects on respective individual ones of the component data-storage systems to allow compression of each of the groups of the data objects at the respective individual component data-storage system.

10. The method of claim 9, wherein the compression of each of the groups of the data objects involves differential storing of the data objects of each group that removes redundant copies of data in the data objects of the corresponding group.

11. The method of claim 8, further comprising directing, by the portal, data objects through plural ones of the logical bins to a single one of the component data-storage systems.

12. The method of claim 8, further comprising directing, by the portal, data objects through a single one of the logical bins to plural ones of the component data-storage systems.

13. The method of claim 8, further comprising the portal responding to removal of one of the component data-storage systems by:
- redirecting logical bins initially mapped to the removed component data-storage system to one or more other of the component data-storage systems; and
- copying data objects stored in the removed component data-storage system to the one or more other component data-storage systems.

14. The method of claim 8, wherein the compression-enhancing routing is a query-based compression-enhancing routing in which the portal queries the component data-storage systems to obtain information regarding degrees of compression of the data objects at the corresponding component data-storage systems.

* * * * *